(12) United States Patent
Kim

(10) Patent No.: US 11,917,760 B2
(45) Date of Patent: Feb. 27, 2024

(54) DISPLAY PANEL AND DISPLAY DEVICE COMPRISING SAME

(71) Applicant: Samsung Display Co., Ltd., Yongin-si (KR)

(72) Inventor: Byoung Yong Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 301 days.

(21) Appl. No.: 17/272,458

(22) PCT Filed: Jul. 8, 2019

(86) PCT No.: PCT/KR2019/008346
§ 371 (c)(1),
(2) Date: Mar. 1, 2021

(87) PCT Pub. No.: WO2020/045819
PCT Pub. Date: Mar. 5, 2020

(65) Prior Publication Data
US 2021/0321517 A1  Oct. 14, 2021

(30) Foreign Application Priority Data

Aug. 27, 2018  (KR) .................. 10-2018-0100325

(51) Int. Cl.
H05K 3/32 (2006.01)
H05K 1/18 (2006.01)
G06F 1/18 (2006.01)

(52) U.S. Cl.
CPC ............ *H05K 1/181* (2013.01); *G06F 1/183* (2013.01); *G06F 1/189* (2013.01); *H05K 3/32* (2013.01); *H05K 2201/10128* (2013.01); *H05K 2203/0285* (2013.01)

(58) Field of Classification Search
CPC .......... H05K 3/32; H05K 2201/10128; H05K 2203/0285
See application file for complete search history.

(56) References Cited

U.S. PATENT DOCUMENTS

| | | |
|---|---|---|
| 2008/0316415 A1 | 12/2008 | Kim et al. |
| 2009/0103037 A1 | 4/2009 | Abe et al. |
| 2014/0043577 A1 | 2/2014 | Kim et al. |

(Continued)

FOREIGN PATENT DOCUMENTS

| | | |
|---|---|---|
| CN | 103582296 A | 2/2014 |
| CN | 107527937 A | 12/2017 |

(Continued)

OTHER PUBLICATIONS

Japanese Office Action dated Apr. 11, 2023, in corresponding JP Application No. JP 2021-510689 (4 pages).

(Continued)

*Primary Examiner* — Sherman Ng
(74) *Attorney, Agent, or Firm* — Lewis Roca Rothgerber Christie LLP

(57) ABSTRACT

A display panel according to one embodiment comprises: a display substrate that includes a display area and a pad area disposed around the display area, at least one pad terminal disposed on the substrate of the pad area, and an open portion which is at least partially and planarly surrounded by the pad terminal.

18 Claims, 22 Drawing Sheets

(56) References Cited

U.S. PATENT DOCUMENTS

| | | | |
|---|---|---|---|
| 2014/0218653 A1 | 8/2014 | Funahashi | |
| 2016/0020422 A1* | 1/2016 | Kim | H10K 50/824 |
| | | | 257/40 |
| 2016/0066409 A1 | 3/2016 | Kwon et al. | |
| 2016/0370663 A1* | 12/2016 | Kim | H01L 27/124 |
| 2016/0377944 A1* | 12/2016 | Park | G02F 1/1345 |
| | | | 349/42 |
| 2017/0288005 A1* | 10/2017 | Kawata | H01L 27/1218 |
| 2017/0345882 A1* | 11/2017 | Nam | H10K 59/123 |
| 2017/0365653 A1* | 12/2017 | Kim | G02F 1/13458 |
| 2018/0131031 A1 | 5/2018 | Ku et al. | |

FOREIGN PATENT DOCUMENTS

| | | |
|---|---|---|
| JP | H 06-003689 A | 1/1994 |
| JP | 2009-098407 A | 5/2009 |
| KR | 10-2005-0111873 A | 11/2005 |
| KR | 10-2008-0036784 A | 4/2008 |
| KR | 2010-0056169 A | 5/2010 |
| KR | 10-2014-0021787 A | 2/2014 |
| KR | 10-1669997 B1 | 10/2016 |
| KR | 10-2018-0000046 A | 1/2018 |
| KR | 10-1864563 B1 | 6/2018 |

OTHER PUBLICATIONS

International Search Report for corresponding Application No. PCT/KR2019/008346 dated Oct. 25, 2019, 4pp.

* cited by examiner

DISPLAY PANEL AND DISPLAY DEVICE COMPRISING SAME

CROSS-REFERENCE TO RELATED APPLICATIONS

This application is a U.S. National Phase Patent Application of Korean International Application No. PCT/KR2019/008346, filed Jul. 8, 2019, which claims priority to and the benefit of Korean Patent Application No. 10-2018-0100325, filed Aug. 27, 2018, the entire content of all of which is incorporated herein by reference.

TECHNICAL FIELD

One or more embodiments of the present disclosure relate to a display panel and a display device including the same.

BACKGROUND ART

A display device is a device that visually displays data. Such a display device includes a substrate with a display area and a non-display area partitioned from each other. In the display area, a plurality of pixels are disposed on the substrate. In the non-display area, a plurality of pads and/or the like are disposed on the substrate. A flexible film (chip-on-film (COF) film) on which a driving circuit and/or the like is mounted is coupled to the plurality of pads to transmit a driving signal to the pixels.

The flexible film may include a plurality of leads coupled to the plurality of pads, and each lead may be bonded to a pad separated from one other. The bolding may be achieved through an ultrasonic bonding process.

A method of testing whether ultrasonic bonding between the pad and the lead is good can be destructive or non-destructive. An example destructive testing method observes a bonding interface between the pad and the lead that are in contact with each other by vertically cutting the pad and the lead. A non-destructive testing method observes the bonding interface using an imaging device and/or the like without destroying the pad and the lead that are in contact with each other.

The non-destructive testing is more advantageous than the destructive testing in that it takes less time to perform the testing.

DISCLOSURE

Technical Problem

An object of the present invention is directed to providing a display device capable of testing bondability in ultrasonic bonding between a display panel and a flexible printed circuit film.

It should be noted that objects of the present invention are not limited to the above-described object, and other objects that are not described herein will be apparent to those skilled in the art from the following descriptions.

Technical Solution

In order to solve the problems, a display panel according to an embodiment includes a display substrate including a display area and a pad area disposed around the display area, at least one pad terminal disposed on the substrate in the pad area, and an open portion at least partially surrounded by the pad terminal in a plan view.

The open portion may pass through the pad terminal from a surface of the pad terminal in a thickness direction.

The pad terminal may include a first pad electrode and a second pad electrode disposed on the first pad electrode and electrically connected to the first pad electrode.

The pad terminal may include an insulating layer disposed between the first pad electrode and the second pad electrode.

The insulating layer may include a plurality of insulating patterns, and the insulating patterns may expose an upper surface of the first pad electrode.

The second pad electrode may cover the plurality of insulating patterns and the exposed upper surface of the first pad electrode.

The second pad electrode may include surface unevenness by conformally reflecting a lower stepped portion formed by the plurality of insulating patterns.

The open portion may include a through-hole passing through the first pad electrode, the second pad electrode, and the insulating layer.

The through-hole may be disposed inside the pad terminal and completely surrounded by the pad terminal in a plan view.

The open portion may have a trench shape that is recessed from one edge of the pad terminal in a plan view.

The at least one pad terminal may include a first pad terminal and a second pad terminal adjacent to each other, and an open portion of the first pad terminal and an open portion of the second pad terminal may face each other.

In order to solve the problems, a display device according to another embodiment includes a display substrate including a display area and a pad area disposed around the display area, a pad terminal disposed on the substrate in the pad area wherein the pad terminal includes a first pad electrode and a second pad electrode disposed on the first pad electrode and electrically connected to the first pad electrode, an open portion at least partially surrounded by the pad terminal, and a circuit board including a lead terminal attached to the pad area and connected to the pad terminal.

The lead terminal may include a first area overlapping the open portion of the pad terminal.

The lead terminal may include a second area disposed around the first area and configured not to overlap the open portion.

The lead terminal may fill at least a portion of the open portion in the first area.

A first thickness of the lead terminal in the first area may be greater than a second thickness of the lead terminal in the second area.

The lead terminal may be in direct contact with the pad terminal.

The lead terminal and the pad terminal may be ultrasonically bonded to each other.

The open portion may include a through-hole passing through the first pad electrode and the second pad electrode in a thickness direction.

The through-hole may be disposed inside the pad terminal and completely surrounded by the pad terminal in a plan view.

Specific details of other exemplary embodiments are included in the detailed description and the accompanying drawings.

Advantageous Effects

A display device according to an embodiment of the present invention includes a through-hole in a pad terminal that is ultrasonically bonded to a lead terminal. The display device may test bondability in ultrasonic bonding between a display panel and a flexible printed circuit film by observing some lead terminals inserted into the through-hole.

Advantageous effects of the present invention are not limited to the above description, and various other effects are included in this specification.

MODES OF THE INVENTION

Figure 1:
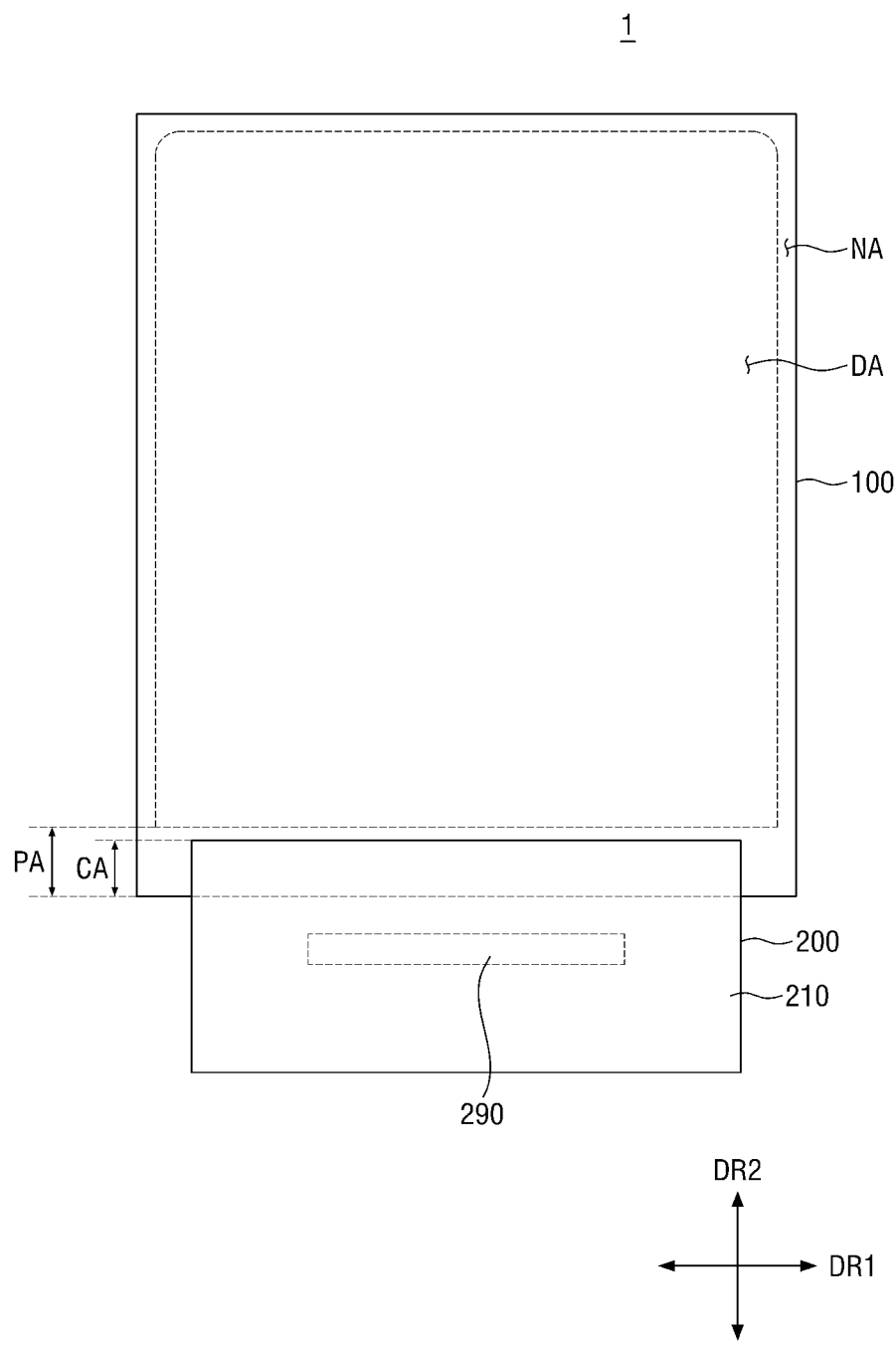
FIG. 1 is a plan layout view of a display device according to an embodiment.

Advantages and features of the present invention, and implementation methods thereof will be clarified through the following embodiments described in detail with reference to the accompanying drawings. However, the present invention is not limited to the following embodiments and may be implemented in various forms. That is, the present invention is merely defined by the scope of the claims.

Also, when it is mentioned that an element or layer is "on" another element or layer, the element or layer may be formed directly on the other element or layer, or a third element or layer may be interposed therebetween. In contrast, when an element is referred to as being "directly on" another element, there are no intervening elements present.

Like reference numerals refer to like elements throughout.

Hereinafter, embodiments of the present invention will be described with reference to the accompanying drawings.

FIG. 1 is a plan layout view of a display device according to an embodiment.

A display device 1 is a device for displaying a video or a still image. The display device 1 may be used as a display screen for various kinds of products (such as a television, a notebook computer, a monitor, a billboard, and/or an Internet of Things device), as well as portable electronic devices (such as a mobile phone, a smartphone, a tablet personal computer (PC), a smartwatch, a watch phone, a mobile communication terminal, an electronic notebook, an e-book reader, a portable multimedia player (PMP), a navigation device, and/or an ultra-mobile PC (UMPC)).

Referring to FIG. 1, the display device 1 may include a display panel 100 that displays an image and a flexible printed circuit board 200 that is connected to the display panel 100.

The display panel 100 may be, for example, an organic light emitting display panel. In the following embodiments, an organic light emitting display panel is applied as the display panel 100. However, the present invention is not limited thereto, and other types of display panels (such as a liquid crystal display (LCD) panel, a quantum dot organic light emitting display (QD-OLED) panel, a quantum dot liquid crystal display (QD-LCD), a quantum nano light emitting display (QNED) panel, and/or a micro-LED) may be applied.

The display panel 100 may include a display area DA that displays an image and a non-display area NA that is placed around the display area DA. The display area DA may have a rectangular shape with right-angled corners or a rectangular shape with rounded corners in a plan view. The display area DA may have a long side and a short side. The short side of the display area DA may be a side extending in a first direction DR1. The long side of the display area DA may be a side extending in a second direction DR2. However, the planar shape of the display area DA is not limited to the rectangular shape, and may be a circular shape, an elliptical shape, or other various shapes. The non-display area NA may be disposed adjacent to both short sides and both long sides of the display area DA. In this case, the non-display area NA may surround all sides of the display area DA and form an edge of the display area DA. However, the present invention is not limited thereto, and the non-display area NA may be disposed adjacent to only both short sides or both long sides of the display area DA.

The non-display area NA may further include a pad area PA on one side of the display panel 100 in the second direction DR2. The display panel 100 may include at least one panel pad terminal PE (see FIG. 3). The pad terminal PE may be disposed in the pad area PA.

The flexible printed circuit board 200 may be disposed on an upper surface of the pad area PA of the display panel 100. The flexible printed circuit board 200 may be attached to the pad area PA.

The flexible printed circuit board 200 may include an attachment area CA attached to the pad area PA. The attachment area CA may overlap the pad area PA in a thickness direction. The flexible printed circuit board 200 may include a lead terminal LE (see FIG. 3). The lead terminal LE may be disposed in the attachment area CA.

The flexible printed circuit board 200 may include a data driving integrated circuit 290 disposed on one surface of the flexible printed circuit board 200. The data driving integrated circuit 290 may be implemented as a data driving chip and may be attached to the display panel through the flexible printed circuit board 200 in a chip-op-film (COF) manner. However, the present invention is not limited thereto, and the data driving integrated circuit 290 may be attached to a plastic substrate or a glass substrate in a chip-on-plastic (COP) or chip-on-glass (COG) manner, respectively. he following description focuses on a case in which the data driving integrated circuit 290 is implemented as a data driving chip in the chip-on-film (COF) manner.

The configuration of the flexible printed circuit board 200 and the display panel 100 will be described below.

Figure 2:
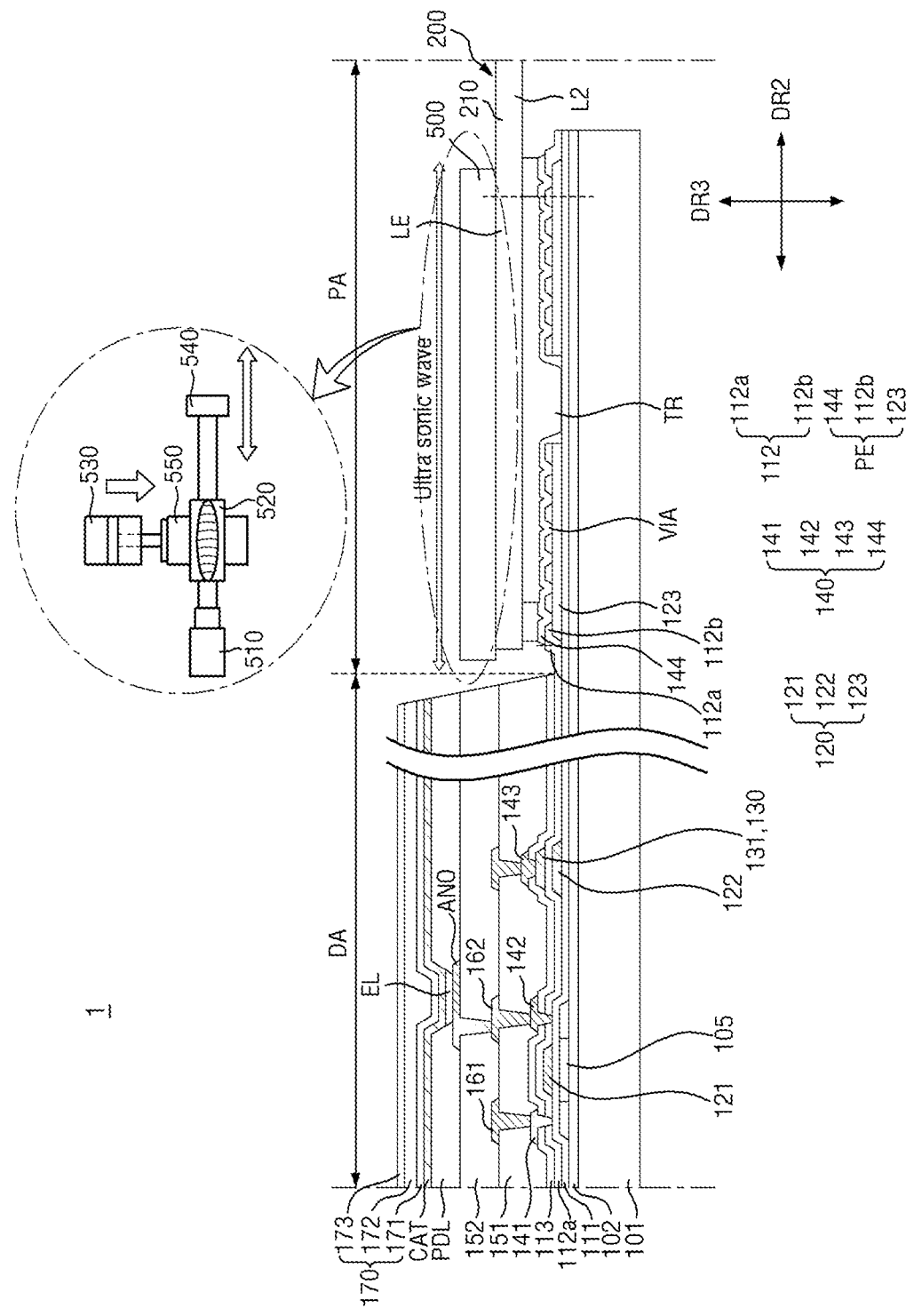
FIG. 2 is a cross-sectional view of the display device of FIG. 1.

FIG. 2 is a cross-sectional view of the display device of FIG. 1. FIG. 2 shows a sectional shape of a pad area PA and one pixel area of the display area DA in FIG. 1.

Referring to FIG. 2, the display panel 100 may include a base substrate 101, a plurality of conductive layers, a plurality of insulting layers for insulating the layers, an organic layer EL, and the like.

The base substrate 101 may be disposed over the display area DA and the non-display area NA. The base substrate 101 may function to support several elements disposed thereon. In an embodiment, the base substrate 101 may be a rigid substrate containing a rigid material (such as soft glass, quartz, and/or the like).

A buffer layer 102 may be disposed on the base substrate 101. The buffer layer 102 may prevent penetration of moisture and/or oxygen from the outside through the base substrate 101. Also, the buffer layer 102 may planarize the surface of the base substrate 101. The buffer layer 102 may include one of a silicon nitride ($SiN_x$) film, a silicon oxide ($SiO_2$) film, or a silicon oxynitride ($SiO_xN_y$) film.

A semiconductor layer 105 may be disposed on the buffer layer 102. The semiconductor layer 105 forms a channel of a thin-film transistor. The semiconductor layer 105 may be disposed in each pixel of the display area DA, and in some cases, may also be disposed in the non-display area NA. The semiconductor layer 105 may include a source/drain area and an active area. The semiconductor layer 105 may include polycrystalline silicon.

A first insulating layer 111 may be disposed on the semiconductor layer 105. The first insulating layer 111 may be disposed on the entire surface of the base substrate 101. The first insulating layer 111 may be a gate insulating film with a gate insulating function. The first insulating layer 111 may contain a silicon compound, a metal oxide, etc. For example, the first insulating layer 111 may contain a silicon oxide, a silicon nitride, a silicon oxynitride, an aluminum oxide, a tantalum oxide, a hafnium oxide, a zirconium oxide, a titanium oxide, and/or the like. The materials may be used alone or in combination.

A first conductive layer 120 may be disposed on the first insulating layer 111. In an embodiment, the first conductive layer 120 may include a gate electrode 121 of a thin-film transistor TFT and a first electrode 122 of a storage capacitor, a first pad electrode 123, and a first signal line L1 (see FIG. 3). The first pad electrode 123 may be formed as a pad terminal PE as described below.

The first conductive layer 120 may contain a metal material. The first conductive layer 120 may contain one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single-layer film or a stacked film made of the above-described materials.

A second insulating layer 112 may be disposed on the first conductive layer 120. The second insulating layer may include a first sub-insulating layer 112a and a second sub-insulating layer 112b. The first sub-insulating layer 112a may be disposed in the display area DA and may also be disposed in a portion of the pad area PA by extending outward. The first sub-insulating layer 112a may be integrally formed in the display area DA and in a portion of the pad area PA. The first sub-insulating layer 112a may insulate the first conductive layer 120 and a second conductive layer 130 in the display area DA. For example, the first sub-insulating layer 112a may insulate the first electrode 122 and a second electrode 131 of the storage capacitor.

The second sub-insulating layer 112b may be disposed in the pad area PA. Both side surfaces of the second sub-insulating layer 112b may protrude outward from the first pad electrode 123 and may be aligned with both side surfaces of a second pad electrode 144 (which will be described below).

The second sub-insulating layer 112b may include a plurality of insulating patterns. The insulating patterns may be spaced apart in one direction and separated from one another along the one direction. The second sub-insulating layer 112b may include a stepped portion between an area where the insulating patterns are disposed and an area where the insulating patterns are not disposed. The stepped portion may include a plurality of stepped portions. That is, the second sub-insulating layer 112b may have a convex portion in the area where the insulating patterns are disposed and may have a concave portion in the area where the insulating patterns are not disposed. The second sub-insulating layer 112b may include surface unevenness. The second sub-insulating layer 112b may include a via hole VIA disposed between the insulating patterns. The via hole VIA may be formed through the second sub-insulating layer 112b from a surface of the second sub-insulating layer 112b in the thickness direction. The via hole VIA may expose an upper surface of the first pad electrode 123. The second sub-insulating layer 112b may have a concave portion in the area where the via hole VIA is disposed. The second pad electrode 144, which will be described below, may be electrically connected to the first pad electrode 123 through the via hole VIA. In an embodiment, the second sub-insulating layer 112b may form the pad terminal PE.

The second insulating layer 112 may have the example materials of the first insulating layer 111.

A second conductive layer 130 may be disposed on the second insulating layer 112. The second conductive layer 130 may include the second electrode 131 of the storage capacitor. The material of the second conductive layer 130 may be selected from among the above-described materials of the first conductive layer 120. The first electrode 122 of the storage capacitor and the second electrode 131 of the storage capacitor may form a capacitor through the second insulating layer 112.

A third insulating layer 113 may be disposed on the second conductive layer 130. The third insulating layer 113 may contain the above-described materials of the first insulating layer 111.

A third conductive layer 140 may be disposed on the third insulating layer 113. The third conductive layer 140 may include a source electrode 141, a drain electrode 142, a power supply voltage electrode 143, and a second pad electrode 144. The third conductive layer 140 may contain the above-described materials of the first conductive layer 120. The third conductive layer 140 may be a single-layer film made of the exemplified material. However, the present invention is not limited thereto, and the third conductive layer 140 may be a stacked film. For example, the third conductive layer 140 may be formed in a stacked structure (such as Ti/Al/Ti, Mo/Al/Mo, Mo/AlGe/Mo, and/or Ti/Cu).

The second pad electrode 144 may be disposed on the second sub-insulating layer 112b. The second pad electrode 144 may cover the upper surfaces and side surfaces of a plurality of insulating patterns of the second sub-insulating layer 112b. The second pad electrode 144 may be disposed in an area where the insulating patterns of the second sub-insulating layer 112b are disposed and an area where the insulating patterns are not disposed, that is, in an area in which the via hole VIA is disposed. The second pad electrode 144 may partially conformally reflect a lower stepped portion formed by the underlying second sub-insulating layer 112b. That is, the second pad electrode 144 may have a convex portion having a protruding surface in the area where the insulating patterns are disposed, and may have a concave portion having a receding surface in the area where the insulating patterns are not disposed, that is, in the area where the via hole VIA is formed. That is, the second pad electrode 144 may have surface unevenness formed thereon because the second sub-insulating layer 112b with a predetermined stepped portion is disposed thereunder.

As described above, the third insulating layer 113 is disposed on the second conductive layer 130, and structures disposed above the second conductive layer 130, including the third insulating layer 113, will be omitted or removed in the pad area PA. Thus, an upper surface of the second pad electrode 144 disposed in the pad area PA may be exposed by the omitted or removed structures. This will be described later.

A first via layer 151 may be disposed on the third conductive layer 140. The first via layer 151 may contain an organic insulating material (such as acrylic resins (polyacrylate resins), epoxy resins, phenolic resins, polyamide resins, polyimide resins, unsaturated polyester resins, polyphenylene ether resins, polyphenylene sulfide resins, and/or benzocyclobutene (BCB)).

A fourth conductive layer may be disposed on the first via layer 151. The fourth conductive layer may include power supply voltage lines (including 161) and a connection electrode 162. The power supply voltage line 161 may be electrically connected to a source electrode 141 of the thin-film transistor TFT through a contact hole passing through the first via layer 151. The connection electrode 162 may be electrically connected to a drain electrode 142 of the thin-film transistor TFT through a contact hole passing through the first via layer 151. The power supply voltage line may be electrically connected to the power supply voltage electrode 143 through a contact hole passing through the first via layer 151.

The fourth conductive layer may contain one or more metals selected from among aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and molybdenum (Mo). The fourth conductive layer may be a single-layer film. However, the present invention is not limited thereto, and the fourth conductive layer may be made of a multilayer film. For example, the fourth conductive layer may be formed in a stacked structure (such as Ti/Al/Ti, Mo/Al/Mo, Mo/AlGe/Mo, and/or Ti/Cu).

A second via layer 152 is disposed on the fourth conductive layer. The second via layer 152 may contain above-described materials of the first via layer 151. The second via layer 152 may contain an organic insulating material (such as acrylic resins (polyacrylate resins), epoxy resins, phenolic resins, polyamide resins, polyimide resins, unsaturated polyester resins, polyphenylene ether resins, polyphenylene sulfide resins, and/or benzocyclobutene (BCB)).

An anode ANO is disposed on the second via layer 152. The anode ANO may be electrically connected to the connection electrode 162 through a contact hole passing through the second via layer 152.

A pixel defining layer PDL may be disposed on the anode ANO. The pixel defining layer PDL may include an opening exposing the anode ANO. The pixel defining layer PDL may be made of an organic insulating material or an inorganic insulating material. As an example, the pixel defining layer PDL may contain materials such as photoresists, polyimide resins, acrylic resins, silicon compounds, and/or polyacrylic resins.

The organic layer EL may be disposed on an upper surface of the anode ANO and in the opening of the pixel defining layer PDL. A cathode CAT is disposed on the organic layer EL and the pixel defining layer PDL. The cathode CAT may be a common electrode disposed on a plurality of pixels.

A thin-film encapsulation layer 170 is disposed on the cathode CAT. The thin-film encapsulation layer 170 may cover an organic light emitting diode (OLED). The thin-film encapsulation layer 170 may include a multilayer film in which an inorganic layer and an organic layer are alternately stacked. For example, the thin-film encapsulation layer 170 may include a first inorganic film 171, an organic film 172, and a second inorganic film 173 which are sequentially stacked.

The flexible printed circuit film (board) 200 may be disposed above the above-described second pad electrode 144. The flexible printed circuit film 200 may be attached to the pad area PA of the display panel 100 where the second pad electrode 144 is disposed.

The flexible printed circuit film 200 may include a base film 210, a lead terminal LE, and a second signal line L2. Although not shown, the flexible printed circuit film 200 may further include a data driving integrated circuit 290 (see FIG. 3). The lead terminal LE and the second signal line L2 may be disposed on the base film 210. Specifically, the lead terminal LE and the second signal line L2 may be disposed on one surface of the base film 210. The lead terminal LE may be electrically connected to the data driving integrated circuit 290 through the second signal line L2. The lead terminal LE and the second signal line L2 may overlap the pad area PA. The lead terminal LE may be directly coupled to the pad terminal PE, which will be described below.

The pad terminal PE according to an embodiment may include the first pad electrode 123, the second sub-insulating layer 112b, and the second pad electrode 144. The stacked structure of the pad terminal PE has been described along with the cross-section of the pad area PA of the display panel 100, and thus will be omitted here.

In some embodiments, the configuration and stacked structure of the pad terminal PE may be variously modified. For example, the pad terminal PE may have a sequentially stacked structure (the first pad electrode 123, the second sub-insulating layer 112*b*, and the second pad electrode 144) according to an embodiment, and in some embodiments the pad terminal PE may be defined by including only the second pad electrode 144 and the first pad electrode 123, and in some embodiments may be defined by including only the second pad electrode 144.

Also, the pad terminal PE may have a stacked structure according to an embodiment. The first pad electrode 123 may include a plurality of conductive patterns, and the second sub-insulating layer 112*b* may have a structure including no insulating patterns or a structure including insulating patterns. In this case, the second pad electrode 144 may have surface unevenness by partially conformally reflecting a stepped portion formed by the first pad electrode 123 and/or the second sub-insulating layer 112*b*.

Also, the pad terminal PE may further include a third pad electrode between the first pad electrode 123 and the second pad electrode 144. The third pad electrode may be included in the second conductive layer 130.

In addition, the first pad electrode of the pad terminal PE is part of the first conductive layer 120, but the second pad electrode of the pad terminal PE may be disposed on the fourth conductive layer. The first pad electrode may be part of the second conductive layer 130, and the second pad electrode may be formed of (part of) the third conductive layer 140 or the fourth conductive layer.

Also, it will be appreciated that an insulating layer disposed between the pad electrodes of the pad terminal PE may be variously modified depending on the stacked structure of the pad terminal PE that can be variously modified.

The following description focuses on the pad terminal PE, which includes the first pad electrode 123 disposed on the first conductive layer 120, the second sub-insulating layer 112*b*, and the second pad electrode 144 disposed on the third conductive layer 140.

The pad terminal PE and the lead terminal LE according to an embodiment may be ultrasonically bonded to each other. The pad terminal PE and the lead terminal LE may be coupled to each other without any element or layer interposed therebetween. That is, the pad terminal PE and the lead terminal LE may be directly coupled to each other. The ultrasonic bonding may be performed through an ultrasonic bonding device 500.

As shown in FIG. 2, the ultrasonic device 500 may include a vibration generating unit 510, a vibration unit 520 connected to the vibration generating unit 510, a pressing unit 530 configured to amplify the vibration amplitude of the vibration unit 520, and a vibration transmitting unit 540 connected to the vibration unit 520.

The vibration generating unit 510 may convert electrical energy into vibration energy. The vibration unit 520 may vibrate with the vibration energy converted by the vibration generating unit 510. The vibration unit 520 may vibrate in a certain vibration direction with a predetermined amplitude. The amplitude of the vibration unit 520 may be amplified in a direction parallel to the vibration direction through the pressing unit 530 connected to the vibration unit 520. The vibration transmitting unit 540 may transmit the vibration of the vibration unit 520 to a target to be ultrasonically bonded. A support unit 550 may fix upper and lower surfaces of the vibration unit 520 to prevent the vibration unit 520 and the vibration transmitting unit 540 from vertically moving due to the vibration.

Figure 5:
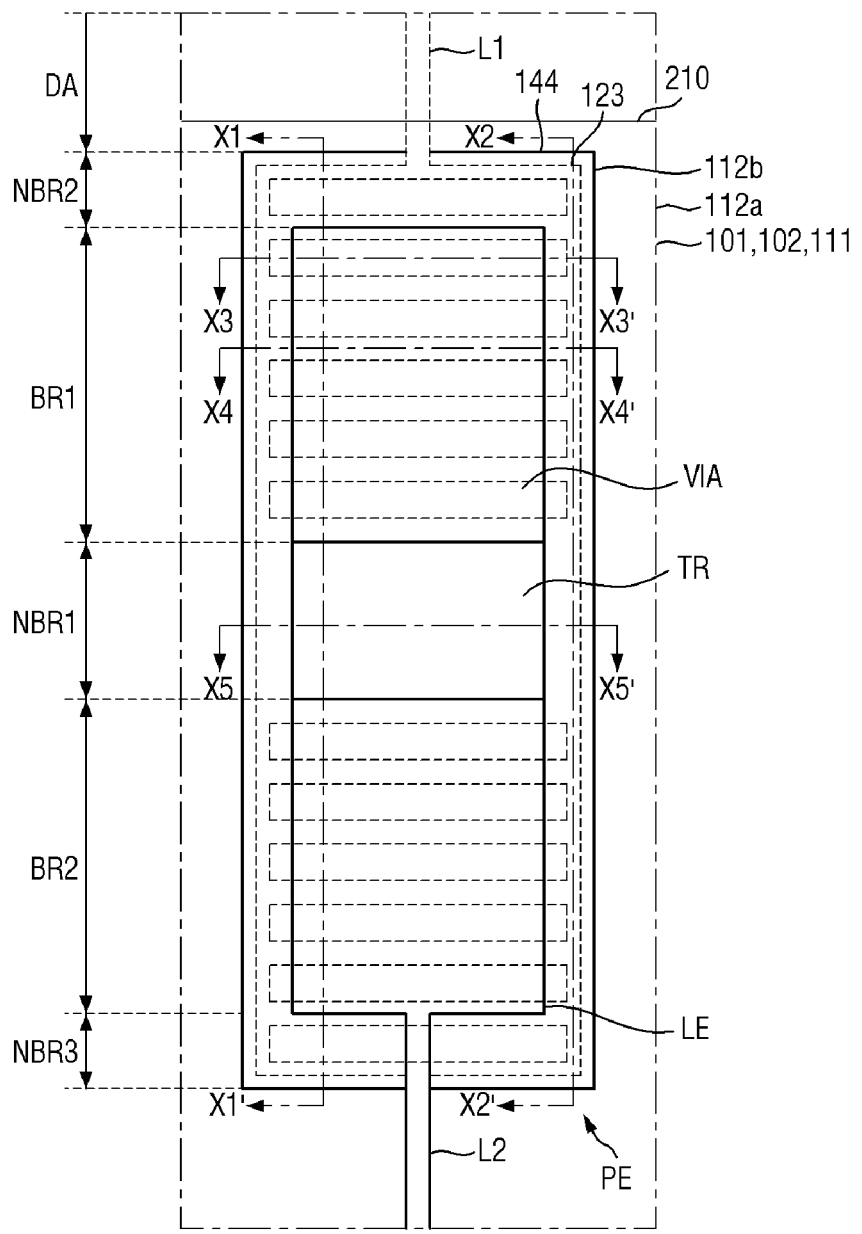
FIG. 5 is a plan view showing one pad terminal and a lead terminal attached to the pad terminal according to the embodiment of FIG. 4.

In an embodiment, the ultrasonic device 500 is brought into contact with the other surface of the flexible printed circuit board 200 to maintain a constant pressure downward, such that the vibration transmitting unit 540 can efficiently transmit the vibration to the flexible printed circuit board 200. In this case, as shown in FIG. 5, the vibration transmitting unit 540 of the ultrasonic device 500 may cause ultrasonic bonding while overlapping the entire area of the flexible printed circuit board 200 disposed below the vibration transmitting unit 540.

The ultrasonic device 500 may vibrate the lead terminal LE in a vibration direction while vibrating in the predetermined vibration direction. However, in this case, the pad terminal PE may slightly vibrate in the vibration direction due to the vibration transmitted through the lead terminal LE, but the magnitude of the vibration may be insignificant. Accordingly, the amplitude of the vibration of the vibration transmitting unit 540 in the vibration direction may be considered to be substantially the same as a distance that the lead terminal LE has moved on the pad terminal PE in the vibration direction. In an embodiment, the vibration direction may be the second direction DR2. That is, the vibration direction may be a direction in which the long sides of the pad terminal PE and the lead terminal LE extend.

When the lead terminal LE is ultrasonically vibrated on one surface of the pad terminal PE, a predetermined frictional force is generated at an interface between one surface of the pad terminal PE and one surface of the lead terminal LE, and frictional heat may be generated due to the frictional force. When the frictional heat is sufficient to melt materials forming the pad terminal PE and the lead terminal LE, a panel melting area 144*b* of the pad terminal PE adjacent to the lead terminal LE and a lead melting area LEb of the lead terminal LE adjacent to the pad terminal PE may be melted. That is, the pad terminal PE may include a panel non-melting area 144*a* and the panel melting area 144*b*. Also, the lead terminal LE may include a lead non-melting area LEa and the lead melting area LEb.

The panel non-melting area 144*a* may be an area that includes only a material contained in the pad terminal PE. The lead non-melting area LEa may be an area that includes only a material contained in the lead terminal LE.

The panel melting area 144*b* may be an area where the material contained in the lead terminal LE is diffused such that the material of the pad terminal PE and the material of the lead terminal LE are mixed, and the lead melting area LEb may be an area where the material contained in the pad terminal PE is diffused such that the material of the lead terminal LE and the material of the pad terminal PE are mixed. For example, when the lead terminal LE contains silver (Ag), gold (Au), or copper (Cu) and the pad terminal PE contains Ti/Al/Ti, the panel melting area 144*b* may be an area where Ti and/or Al of the pad terminal PE and silver (Ag), gold (Au), or copper (Cu) of the lead terminal LE are mixed. Also, the lead melting area LE1*b* may be an area where silver (Ag), gold (Au), or copper (Cu) of the lead terminal LE and Ti and/or Al of the pad terminal PE are mixed.

In the panel melting area 144*b* and the lead melting area LEb, the pad terminal PE and the lead terminal LE may be coupled to each other while undergoing solidification.

An interface between the pad terminal PE and the lead terminal LE, i.e., an interface between the panel melting area 144*b* and the lead melting area LEb may have a non-flat shape.

In order to check the bonding reliability of the lead terminal LE and the pad terminal PE, the pad terminal PE according to an embodiment may include a through region TR formed on the surface of the second pad electrode 144 in the thickness direction. This will be described later.

Figure 3:
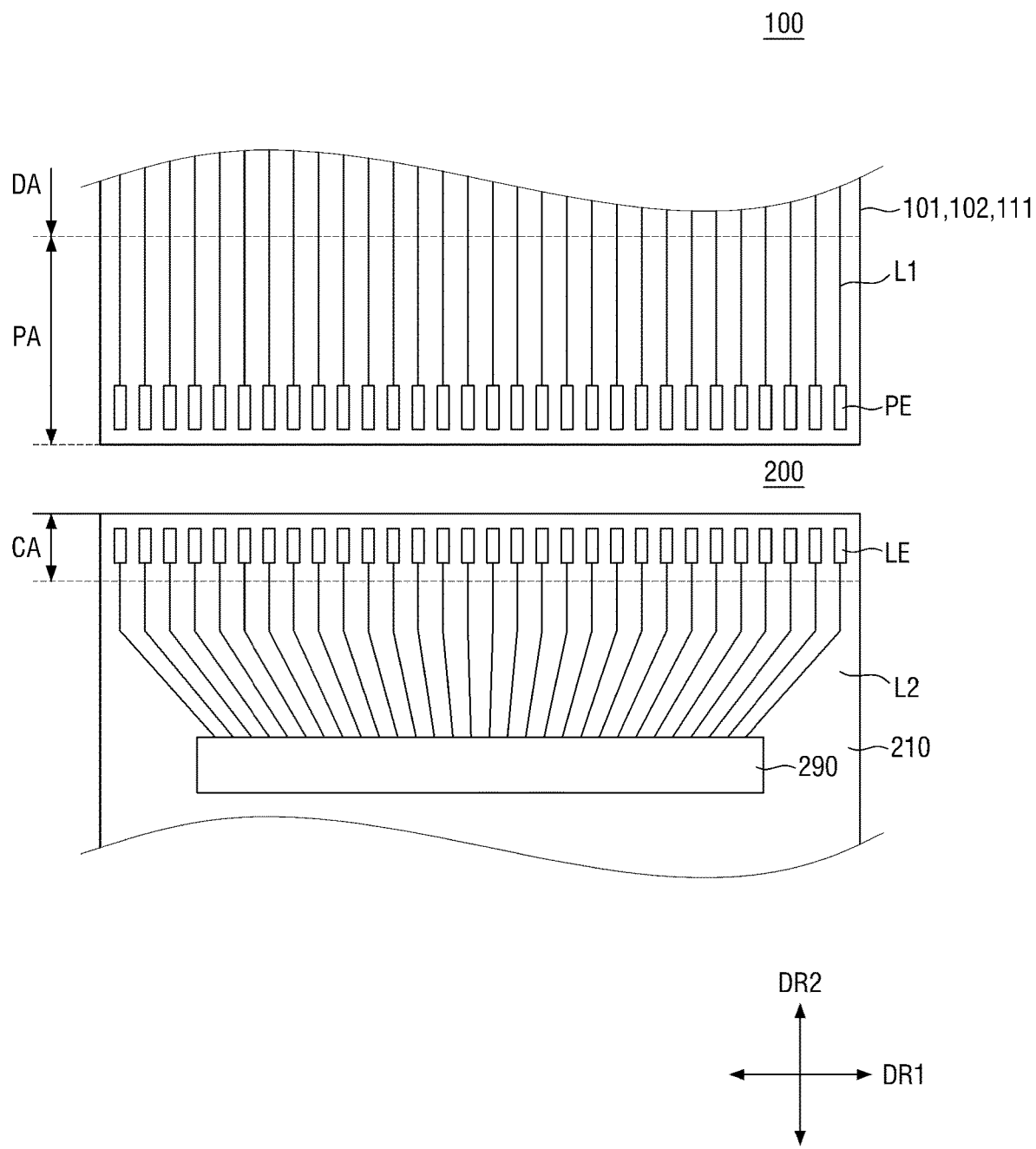
FIG. 3 is a plan layout view of a display panel and a flexible printed circuit board according to an embodiment.
Figure 4:
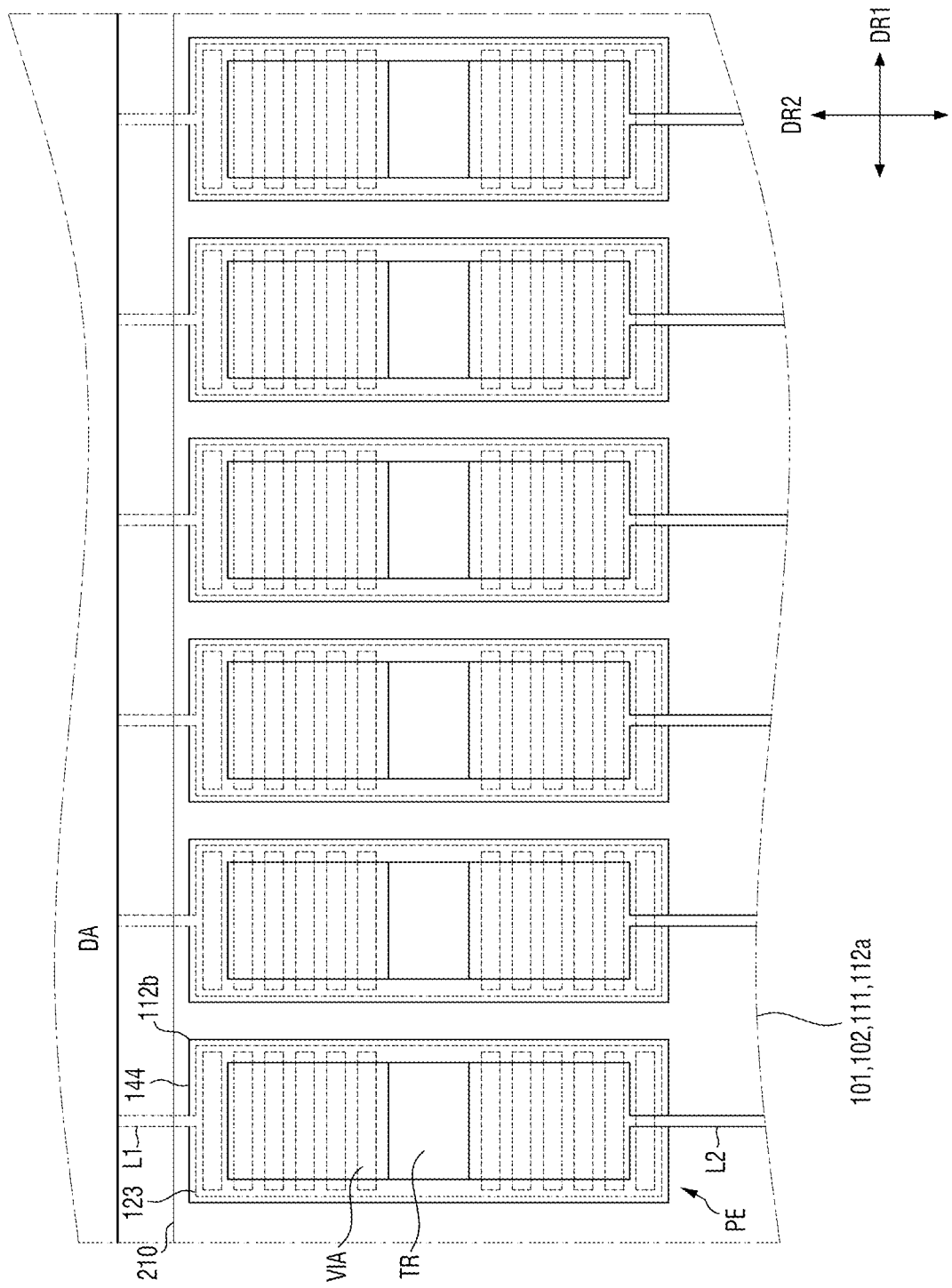
FIG. 4 is a plan layout view of a display panel and a flexible printed circuit board attached to each other according to an embodiment.

FIG. 3 is a plan layout view of a display panel and a flexible printed circuit board according to an embodiment, and FIG. 4 is a plan layout view of a display panel and a flexible printed circuit board attached to each other according to an embodiment.

Referring to FIGS. 3 and 4, a plurality of pad terminals PE may be disposed adjacent to one end of the pad area PA. The plurality of pad terminals PE may be arranged in the first direction DR1 to form a pad row. In the drawing, one pad row is shown, but the present invention is not limited thereto. The pad row may include a plurality of pad rows spaced apart from one another in the second direction DR2. The pad terminal PE may be connected to the first signal line L1. The first signal line L1 may pass through the display area DA in the second direction DR2. Although not shown, the first signal line L1 may be connected to a plurality of pixel transistors disposed in the display area DA. The pad terminal PE may be electrically connected to the plurality of transistors of the display area DA through the first signal line L1.

As described above, the first signal line L1 may be disposed in the same layer (the first conductive layer 120) as the first pad electrode 123 of the pad terminal PE. The planar shape of the first pad electrode 123 may be a rectangular shape with right-angled corners or a rectangular shape with rounded corners. The first pad electrode 123 may have a long side edge and a short side edge. The long side edge of the first pad electrode 123 may extend in the second direction DR2, and the short side edge of the first pad electrode 123 may extend in the first direction DR1. The planar width of the first pad electrode 123 may be greater than the planar width of the first signal line L1.

The flexible printed circuit film 200 may include an attachment area CA. The attachment area CA of the flexible printed circuit film 200 may be attached to the pad area PA of the display panel 100. A plurality of lead terminals LE may be disposed in the attachment area CA. The plurality of lead terminals LE may be arranged in (along) the first direction DR1 to form a lead row. In the drawing, one lead row is shown, but the present invention is not limited thereto. The lead row may include a plurality of lead rows spaced apart from one another in the second direction DR2. The lead terminal LE may be connected to the second signal line L2.

The flexible printed circuit film 200 may include the above-described data driving integrated circuit 290. The data driving integrated circuit 290 may be disposed on one surface of the base film 210. The second signal line L2 may be connected to the data driving integrated circuit 290. The plurality of lead terminals LE may be electrically connected to the data driving integrated circuit 290 through the second signal line L2.

The planar shape of the lead terminal LE may be a rectangular shape with right-angled corners or a rectangular shape with rounded corners. The lead terminal LE may have a long side edge and a short side edge. The long side edge of the lead terminal LE may extend in the second direction DR2, and the short side edge of the lead terminal LE may extend in the first direction DR1. The planar width of the lead terminal LE may be greater than the planar width of the second signal line L2.

Referring to FIG. 4, as described above, the lead terminal LE may be attached to the pad terminal PE and be ultrasonically bonded to the pad terminal PE. The configuration of the pad terminal PE and the lead terminal LE coupled to each other will be described in detail below.

Figure 6:
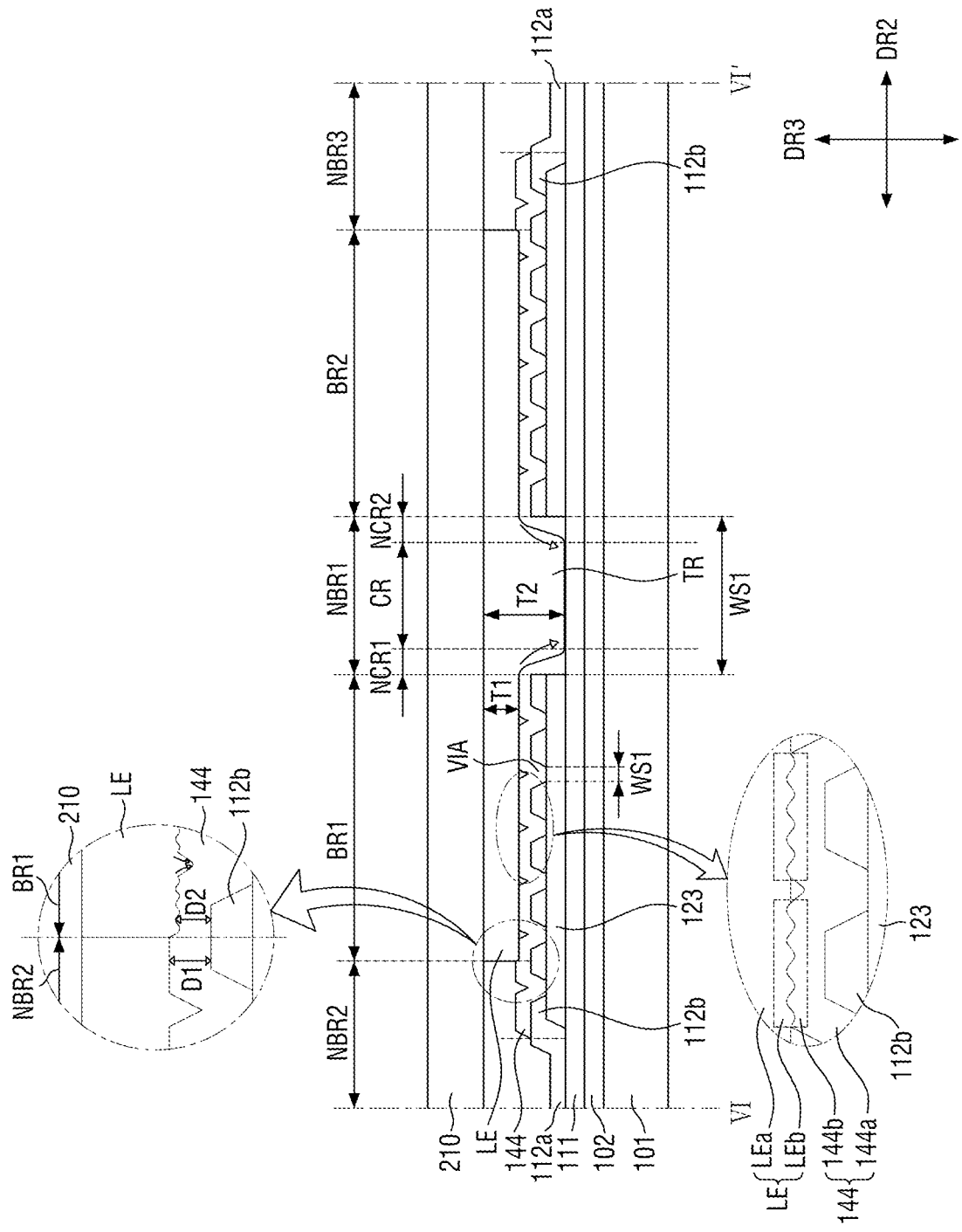
FIG. 6 is a cross-sectional view taken along line VI-VI' of FIG. 5.
Figure 7:
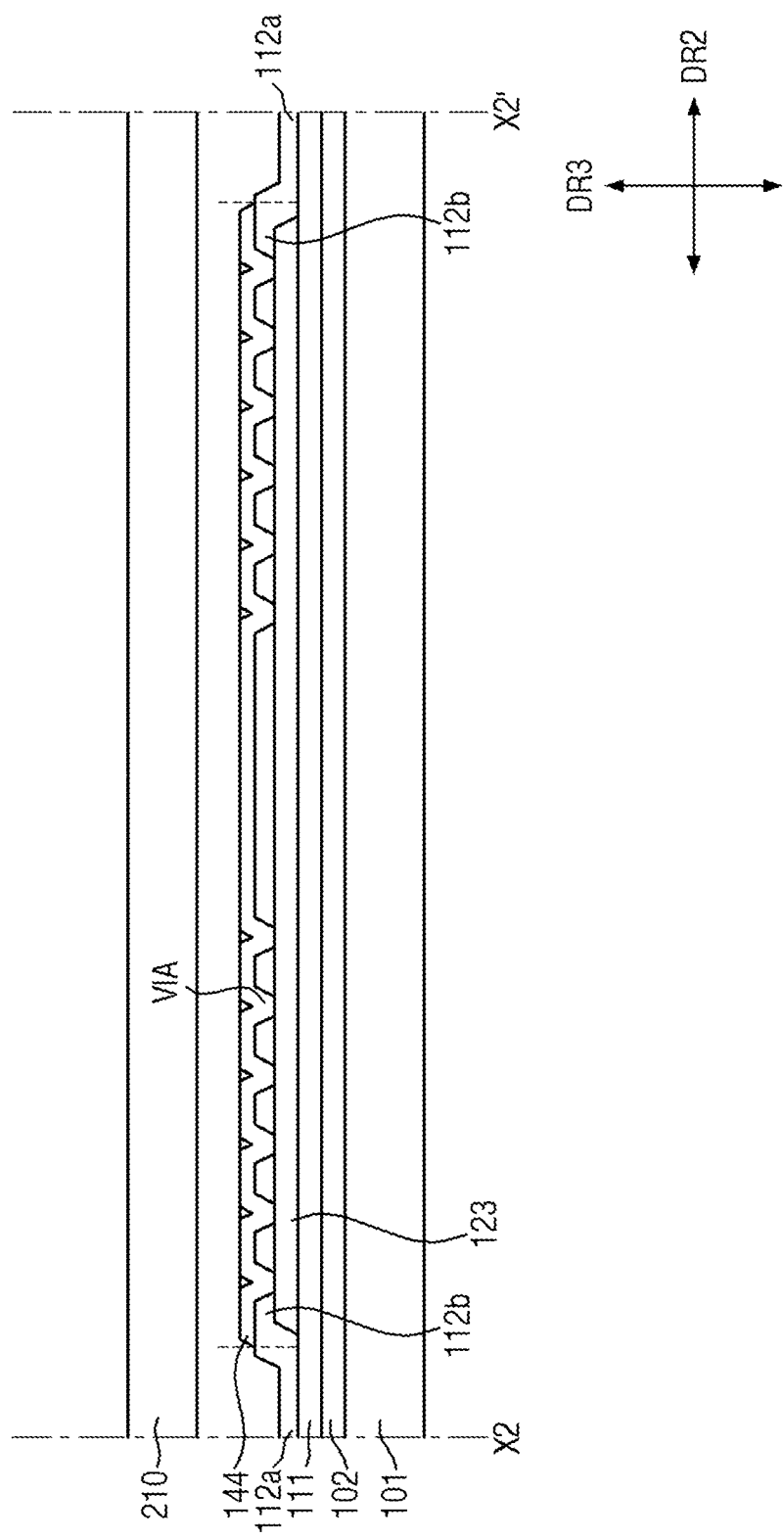
FIG. 7 is a cross-sectional view taken along line VII-VII" of FIG. 5.
Figure 8:
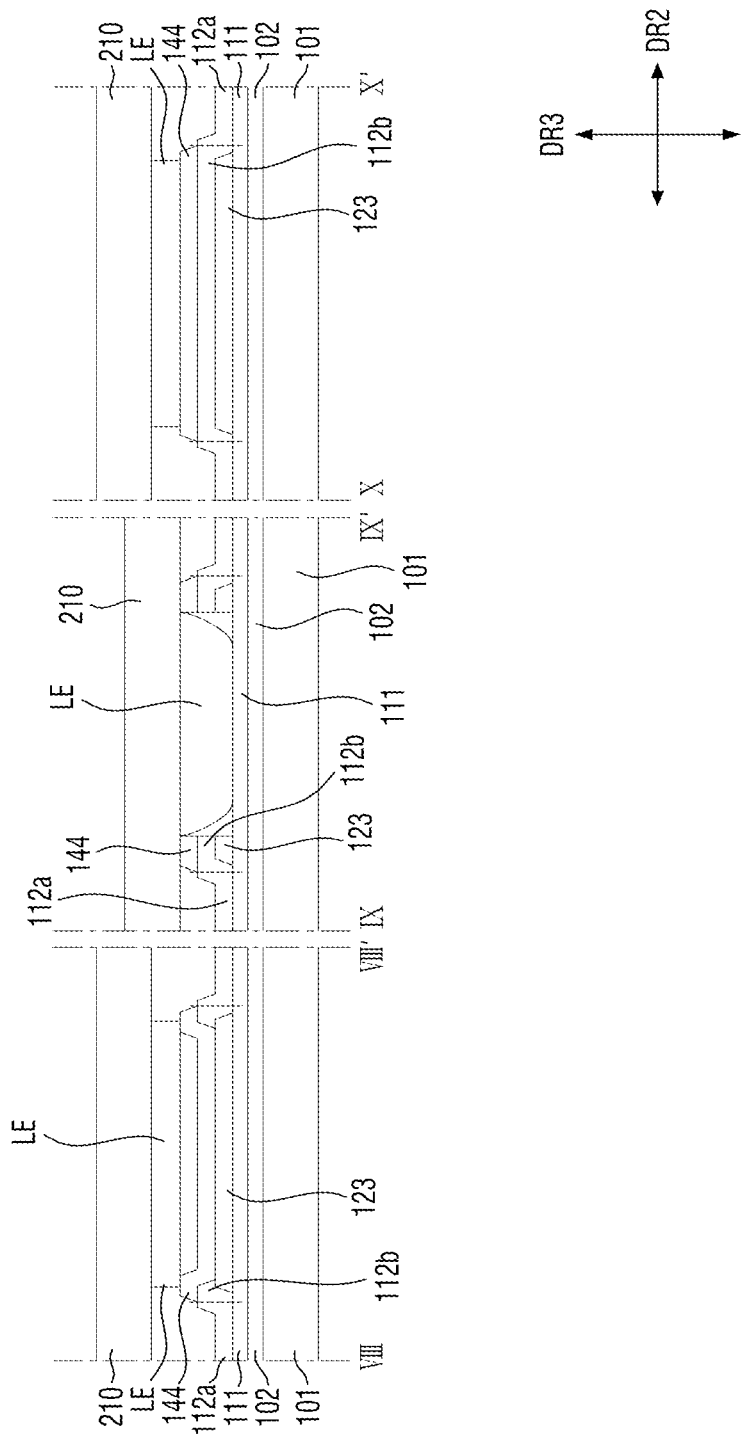
FIG. 8 shows cross-sectional views taken along lines VIII-VIII', IX-IX', and X-X' of FIG. 5.

FIG. 5 is a plan view showing one pad terminal PE and a lead terminal LE attached to the pad terminal PE according to the embodiment of FIG. 4, FIG. 6 is a cross-sectional view taken along line VI-VI' of FIG. 5, FIG. 7 is a cross-sectional view taken along line VII-VII" of FIG. 5, and FIG. 8 shows cross-sectional views taken along lines viii-viii', IX-IX', and X-X' of FIG. 5.

Referring to FIGS. 2 and 5 to 8, the pad terminal PE may include the first pad electrode 123, the second sub-insulating layer 112*b*, and the second pad electrode 144, as described above. The first pad electrode 123 may be connected to the first signal line L1. The first pad electrode 123 may have a rectangular shape with a long side edge and a short side edge as described above. The second sub-insulating layer 112*b* may be disposed on the first pad electrode 123 and may have the same planar shape as the first pad electrode 123. The second sub-insulating layer 112*b* may have a greater planar area than the first pad electrode 123 in a plan view. The second sub-insulating layer 112*b* may be formed to extend outward from the first pad electrode 123. The second sub-insulating layer 112*b* may have a long side edge and a short side edge. The long side edge and the short side edge of the second sub-insulating layer 112*b* may extend in the second direction DR2 and the first direction DR1, respectively, like the long side edge and the short side edge of the first pad electrode 123. The long side edge and the short side edge of the second sub-insulating layer 112*b* may be greater than the long side edge and the short side edge of the first pad electrode 123, respectively.

The above-described first sub-insulating layer 112*a* may be disposed outside the second sub-insulating layer 112*b*. The first sub-insulating layer 112*a* may surround both long and short side edges of the second sub-insulating layer 112*b*.

The second sub-insulating layer 112*b* may have the above-described via hole VIA. The via hole VIA may be formed on the surface of the second sub-insulating layer 112*b* in the thickness direction to expose an upper surface of the first pad electrode 123.

Such via holes VIA may extend in (along) the first direction DR1 and may be spaced apart and separated from one another in (along) the second direction DR2. FIG. 5 shows twelve via holes VIA, but there is no limitation on the number of via holes VIA. However, the present invention is not limited thereto, and for example, the via holes VIA may extend in the second direction DR2 and may be spaced apart and separated from one another in the first direction DR1.

The via hole VIA may have a long side and a short side in a plan view. The via hole VIA may have a long side in the first direction DR1 and a short side in the second direction DR2. However, the present invention is not limited thereto, and the long side of the via hole VIA may extend in the second direction DR2, and the short side of the via hole VIA may extend in the first direction DR1.

The via hole VIA may be disposed inside the first pad electrode 123 in a plan view. The first pad electrode 123 may surround the via hole.

The insulating pattern of the second sub-insulating layer 112*b* may be formed outside the via hole VIA. The insulating pattern may be disposed on the first pad electrode 123. Furthermore, the insulating pattern may be disposed to extend outward from the first pad electrode 123. The insulating pattern may have a shape surrounding the via hole VIA on the first pad electrode 123, have a shape surrounding the outside of the first pad electrode 123 at the outside of the first pad electrode 123 in a plan view, and form an edge of the first pad electrode 123.

The second pad electrode 144 may be disposed on the first pad electrode 123 and the second sub-insulating layer 112b. The second pad electrode 144 may protrude and extend outward from the first pad electrode 123. The second pad electrode 144 may cover the second sub-insulating layer 112b. All side surfaces of the second pad electrode 144 may be overlapped and aligned with corresponding side surfaces of the second sub-insulating layer 112b in the thickness direction. Also, the first sub-insulating layer 112a may be disposed outside the second pad electrode 144 to surround all sides of the second pad electrode 144 from the outside in a plan view. That is, the first sub-insulating layer 112a may form an edge of the second pad electrode 144. The second pad electrode 144 may cover upper surfaces and side surfaces of a plurality of insulating patterns of the second sub-insulating layer 112b. The second pad electrode 144 may be disposed on the via hole VIA between the insulating patterns to cover the exposed first pad electrode 123. The second pad electrode 144 may be electrically connected to the first pad electrode 123 through the via hole VIA.

As described above, the second pad electrode 144 may partially conformally reflect a lower stepped portion formed by the underlying second sub-insulating layer 112b. That is, the second pad electrode 144 may have a convex portion having a protruding surface in the area where the insulating patterns are disposed, and may have a concave portion having a receding surface in the area where the insulating patterns are not disposed, that is, in the area where the via hole VIA is formed. That is, the second pad electrode 144 may have surface unevenness formed thereon because the second sub-insulating layer 112b with a predetermined stepped portion is disposed thereunder.

The pad terminal PE may include the through region TR formed in the thickness direction from the surface of the second pad electrode 144.

Herein, a structure formed in the thickness direction of the pad terminal is referred to as the through region TR, but a term referring to the structure is not limited thereto. For example, the through region may be interpreted in various terms (such as an open portion, an open area, an indentation portion, an indentation area, a recess, and/or a recess area). Also, as in an embodiment, a through area that is disposed inside the pad terminal in a plan view and that is completely surrounded by the pad terminal may be interpreted as a through-hole. Also, as described below, a through region illustrated in FIGS. 12 and 14 may be recessed from one edge of the pad terminal to have a trench shape. Even in this case, the through region may be interpreted in various terms (such as an open portion, an open area, an indentation portion, an indentation area, a recess, and/or a recess area) as described above and depending on the shape.

The through region TR may be formed in the vicinity of a central region of the pad terminal PE. The through region TR may be disposed between the insulating patterns of the second sub-insulating layer 112b in a plan view. The through region TR may pass through the second pad electrode 144, the second sub-insulating layer 112b, and the first pad electrode 123 in the thickness direction. The through region TR may expose an upper surface of the first insulating layer 111 of the pad area PA. Furthermore, the through region TR may expose both side surfaces of the second pad electrode 144, the second sub-insulating layer 112b, and the first pad electrode 123. In an area where the through region TR is formed, both side surfaces of the second pad electrode 144, both side surfaces of the second sub-insulating layer 112b, and both side surfaces of the first pad electrode 123 may be aligned with each other.

As shown in FIG. 4, the through region TR may have a rectangular shape in a plan view. The through region TR may have a long side and a short side. The long side of the through region TR may extend in the first direction DR1, and the short side of the through region TR may extend in the second direction DR2. In a plan view, the long side of the through region TR may be shorter than the long side of the via hole VIA, and the short side of the through region TR may be longer than the short side of the via hole VIA. Both long sides of the through region TR may be overlapped and aligned with a short side of the lead terminal LE, which will be described below, in the thickness direction. The long side of the through region TR may have the same width as the short side of the lead terminal LE, but the present invention is not limited thereto. The long side of the through region TR may have a greater width or a smaller width than the short side of the through region TR. In some embodiments, the through region TR is not rectangular, but may have a circular shape, an elliptical shape, or other polygonal shapes in a plan view.

In an embodiment, the through region TR may be surrounded by the pad terminal PE. That is, the through region TR may be disposed inside the pad terminal PE in a plan view.

As described above, the lead terminal LE may be attached onto the pad terminal PE.

In a plan view, the lead terminal LE may have substantially the same shape as the pad terminal PE. That is, the lead terminal LE may have a rectangular shape with right-angled corners in a plan view. The lead terminal LE may have a long side and a short side. The long side of the lead terminal LE may extend in the second direction DR2, and the short side of the lead terminal LE may extend in the first direction DR1. The long side and the short side of the lead terminal LE may be smaller than the long side and the short side of the pad terminal PE, respectively. The pad terminal PE may be formed to protrude outward from the lead terminal LE. The pad terminal PE may form an edge of the lead terminal LE.

The pad terminal PE may include a bonding region and a non-bonding region according to whether the pad terminal PE is coupled to the lead terminal LE or not. In detail, the pad terminal PE may include the bonding region coupled to the lead terminal LE and the non-bonding region not coupled to the lead terminal LE.

The bonding region of the pad terminal PE may include a first bonding region BR1 and a second bonding region BR2. In the first bonding region BR1 and the second bonding region BR2, the pad terminal PE may overlap the lead terminal LE in the thickness direction. In the first bonding region BR1 and the second bonding region BR2, the pad terminal PE may be ultrasonically bonded to the lead terminal LE. That is, in the first bonding region BR1 and the second bonding region BR2, the pad terminal PE may be coupled to the lead terminal LE without any element or layer interposed therebetween.

The non-bonding region of the pad terminal PE may include first to third non-bonding regions NBR1 to NBR3. As described above, since the pad terminal PE has a larger planar size than the lead terminal LE, the pad terminal PE may have an area that overlaps the lead terminal LE in the thickness direction, and an area that does not overlap the lead terminal LE in the thickness direction. In the second non-bonding region NBR2 and the third non-bonding region NBR3, the pad terminal PE may not overlap the lead terminal LE. In the second non-bonding region NBR2 and the third non-bonding region NBR3, the pad terminal PE may not be coupled to the lead terminal LE. That is, in the second non-bonding region NBR2 and the third non-bonding region NBR3, the pad terminal PE may not be ultrasonically bonded to the lead terminal LE.

Referring to FIG. 6, a second pad thickness D2 between an upper surface of the second sub-insulating layer 112b and one surface of the second pad electrode 144 in the first bonding region BR1 may be smaller than a first pad thickness D1 between an upper surface of the second sub-insulating layer 112b and one surface of the second pad electrode 144 in the second non-bonding region NBR2. In the first bonding region BR1, the pad electrode PE (the second pad electrode 144) is ultrasonically bonded to the lead terminal LE, and thus a material may be melted in some regions in the vicinity of an interface with the lead terminal LE of the second pad electrode 144. The melted material moves to the concave portion of the second pad electrode 144, such that the second pad thickness D2 of the second pad electrode 144 in the first bonding region BR1 may become smaller than the first pad thickness D1.

The through region TR of the pad terminal PE may be disposed in the first non-bonding region NBR1. Since the through region TR passes through the second pad electrode 144, the second sub-insulating layer 112b, and the first pad electrode 123 in the thickness direction from the surface of the second pad electrode 144, the pad terminal PE may not be ultrasonically bonded to the lead terminal LE in the first non-bonding region NBR1. The through region TR according to an embodiment may expose an upper surface of the first insulating layer 111. In the first non-bonding region NBR1, the lead terminal LE may be partially brought into contact with the exposed upper surface of the first insulating layer 111.

As shown in FIG. 6, the interface LEb and 144b between the lead terminal LE and the pad terminal PE (the second pad electrode 144) may be melted in the bonding regions BR1 and BR2. The material melted in the lead melting area LEb adjacent to the first non-bonding region NBR1 may descend to the first non-bonding region NBR1. That is, the through region TR of the pad terminal PE is formed in the first non-bonding region NBR1, and the material melted in the lead melting area LEb adjacent to the first non-bonding region NBR1 may descend to the through region TR. Thus, a second thickness T2 from the base film 210 of the lead terminal LE in the first non-bonding region NBR1 may be greater than a first thickness T1 from the base film 210 of the lead terminal LE in the bonding regions BR1 and BR2.

The first non-bonding region NBR1 may include a contact region CR, and a first non-contact region NCR1 and a second non-contact region NCR2 spaced apart from each other with the contact region CR interposed therebetween. The first non-contact region NCR1 may be disposed between the contact region CR and the first bonding region BR1. The second non-contact region NCR2 may be disposed between the contact region CR and the second bonding region BR2.

As described above, the contact region CR of the pad terminal PE may be an area with which the lead terminal LE and the exposed upper surface of the first insulating layer 111 are brought into contact. In the contact region CR, the lead terminal LE may be located inside the through region TR and may be brought into contact with the exposed upper surface of the first insulating layer 111. In the first non-contact region NCR1 and the second non-contact region NCR2, the lead terminal LE may be located inside the through region TR but may not be brought into contact with the upper surface of the first insulating layer 111.

In the contact region CR, the lead terminal LE may be brought into contact with, but not coupled to, the exposed upper surface of the first insulating layer 111. However, ultrasonic vibration may cause the lead terminal LE and the exposed upper surface of the first insulating layer 111 to be melted, mixed, and coupled to each other in some regions of an interface therebetween. Even in this case, the bonding force between the lead terminal LE and the first insulating layer 111 in the contact region CR may be smaller than the bonding force between the lead terminal LE and the second pad electrode 144 in the bonding regions BR1 and BR2.

The pad terminal PE according to an embodiment may include the through region TR, and the lead terminal LE coupled to the pad terminal PE may be lowered and/or inserted into the through region TR in the first non-bonding region NBR1 to come into contact with the exposed first insulating layer 111. The first insulating layer 111, the buffer layer 102, and the base substrate 101 disposed below the lead terminal LE brought into contact with the first insulating layer 111 may be made of a transparent material. Also, the lead terminal LE may contain an opaque metal material. As described above, gold (Au), silver (Ag), copper (Cu), and/or the like contained in the lead terminal LE may be an opaque material.

The second thickness T2 of the lead terminal LE and the width and area of the contact region CR may be increased when the ultrasonic bonding of the lead terminal LE is accomplished well. In detail, when the ultrasonic bonding is accomplished well, a larger amount of material of the lead terminal LE melted in the first bonding region BR1 and the second bonding region BR2 adjacent to the first non-bonding region NBR1 is moved to the through region TR.

In order to test the reliability of the ultrasonic bonding between the pad terminal PE and the lead terminal LE, an imaging device (not shown) may be used to extract necessary data by observing the lead terminal LE portion that is lowered and/or inserted into the through region TR, from the bottom of the base substrate 101. Since the pad terminal PE according to an embodiment includes the through region TR and the lead terminal LE contains an opaque material, the shape, arrangement, and the like of the lead terminal LE may be observed when viewing the lead terminal LE disposed in the through region TR from a lower surface of the base substrate 101. The imaging device may extract data on the second thickness T2 of the lead terminal LE and the width and area of the contact region CR extracted by observing the second thickness T2 of the lead terminal LE and/or the width and/or area of the contact region CR. Subsequently, the imaging device may compare the extracted data to standard data on the second thickness T2 and/or the width and/or area of the contact region CR to test the reliability of the ultrasonic bonding between the pad terminal PE and the lead terminal LE.

Depending on whether the pad terminal PE and the lead terminal LE are processed, the lead terminal LE may not be brought into contact with the upper surface of the first insulating layer 111 exposed by the pad terminal PE in the first non-bonding region NBR1. As a result, the contact region CR may not be formed. However, even in this case, it is possible to test the reliability of the ultrasonic bonding because the lead terminal LE is lowered and/or inserted into the through region TR to increase the second thickness T2.

Hereinafter, a display device according to another embodiment will be described. In the following embodiments, the same elements as those of the previously described embodiments are referred to by the same reference numerals, and descriptions thereof will be omitted or simplified.

Figure 9A:
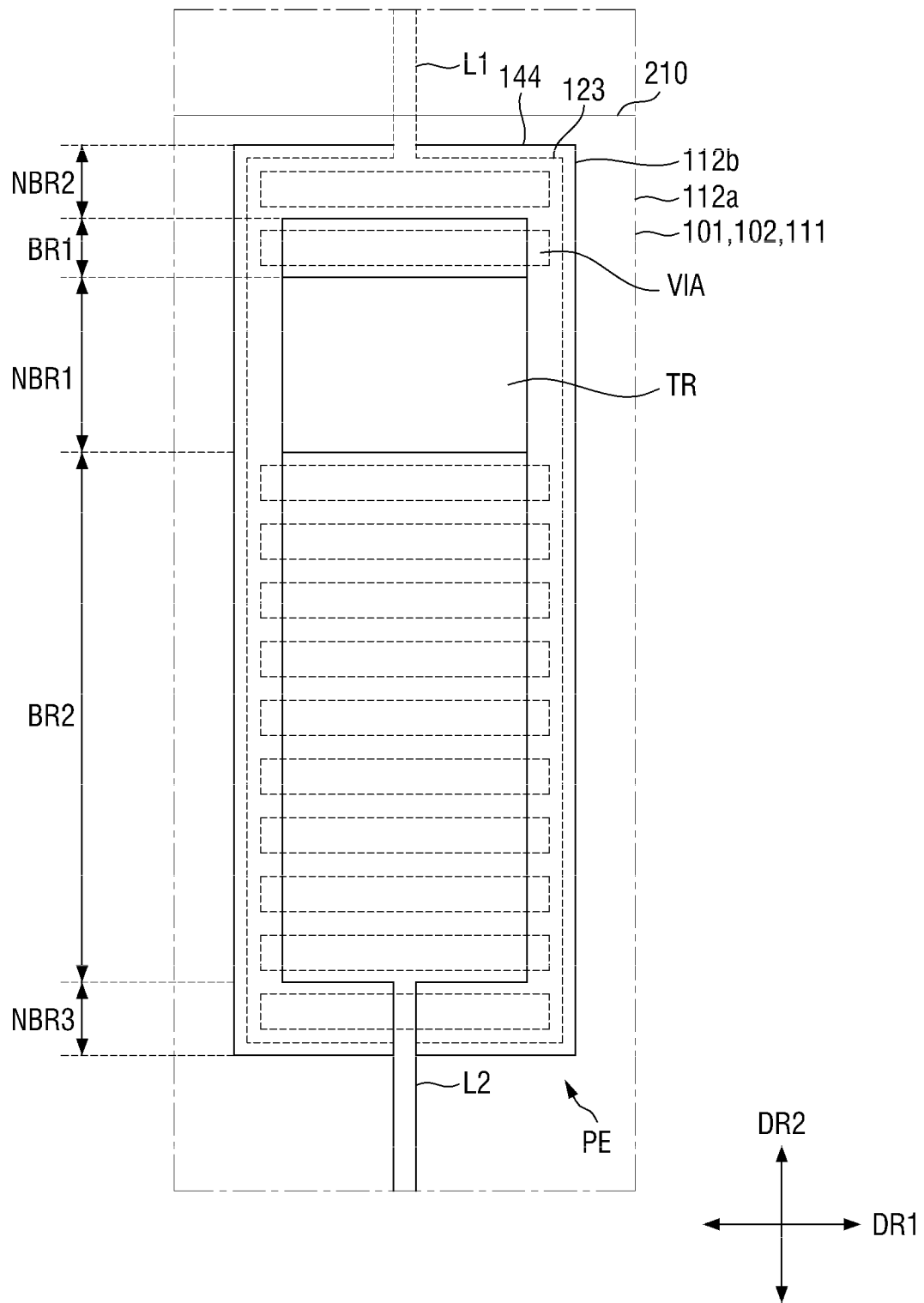
FIG. 9A is a plan view showing a pad terminal and a lead terminal attached to the pad terminal according to a modified example.
Figure 9B:
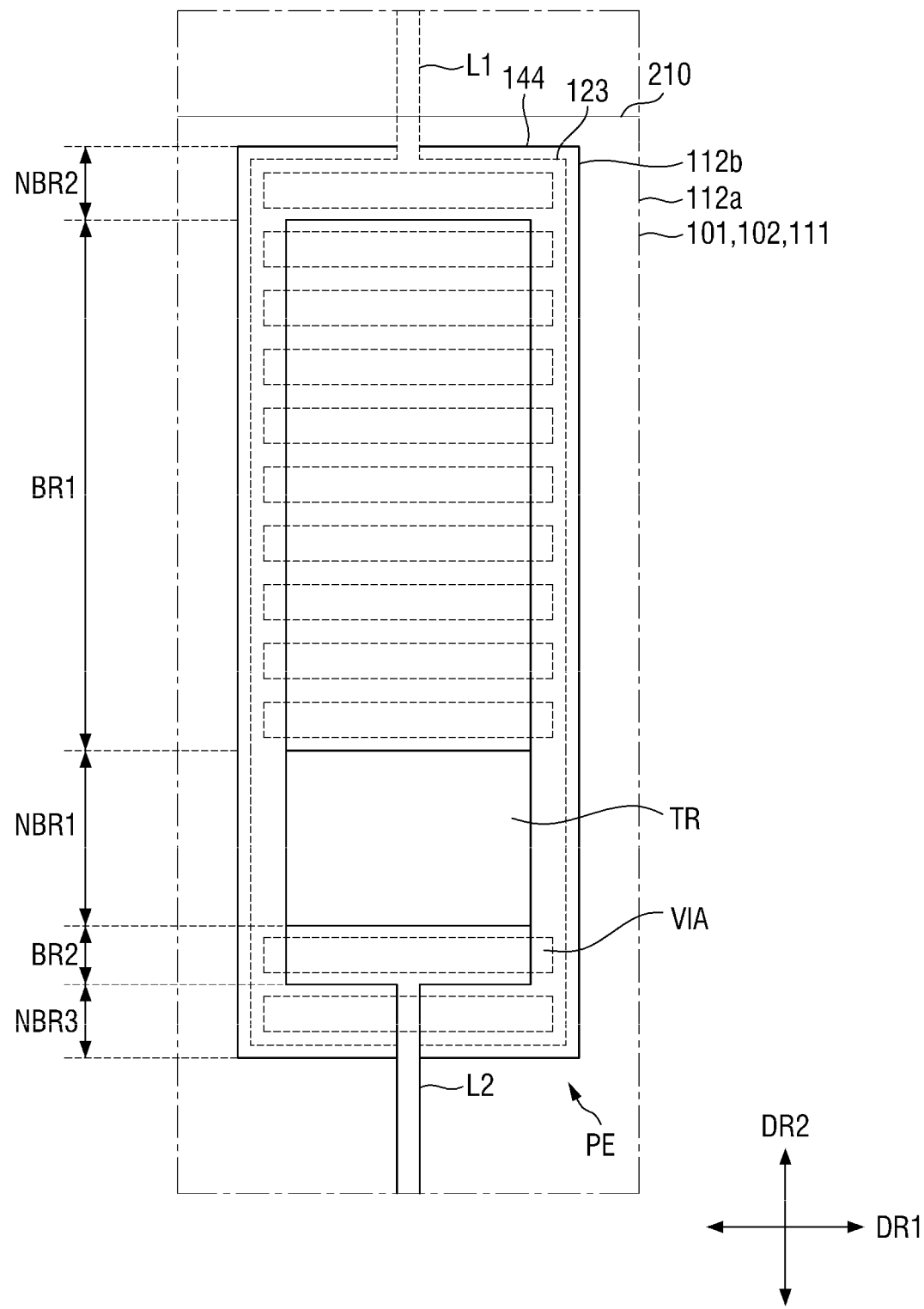
FIG. 9B is a plan view showing a pad terminal and a lead terminal attached to the pad terminal according to a modified example.

FIG. 9A is a plan view showing a pad terminal and a lead terminal attached to the pad terminal according to a modified example, and FIG. 9B is a plan view showing a pad terminal and a lead terminal attached to the pad terminal according to a modified example.

Referring to FIGS. 9A and 9B, a pad terminal PE according to the modified example is different from the pad terminal PE according to an earlier embodiment, in that an area where a through region TR according to the modified example is formed (a first non-bonding region NBR1) is not located in a central region of the pad terminal PE, but is located at an upper side of the pad terminal PE (in the second direction DR2) or at a lower side of the pad terminal PE (in the second direction DR2).

As described above, the pad terminal PE is not ultrasonically bonded to the lead terminal LE in the first non-bonding region NBR1. According to the modified example, when the first non-bonding region NBR1 is disposed in an upper portion or lower portion of the pad terminal PE, the pad terminal PE is not coupled to an upper portion or lower portion of the lead terminal LE, and may be coupled to the lead terminal LE in a central region.

Even in this case, the lead terminal LE coupled to the pad terminal PE may be lowered and/or inserted into the through region TR in the first non-bonding region NBR1 to come into contact with the exposed first insulating layer 111. The first insulating layer 111, the buffer layer 102, and the base substrate 101 disposed below the lead terminal LE brought into contact with the first insulating layer 111 may be made of a transparent material.

The second thickness T2 of the lead terminal LE and the width and area of the contact region CR may be increased when the ultrasonic bonding of the lead terminal LE is accomplished well. In detail, when the ultrasonic bonding is accomplished well, a larger amount of material of the lead terminal LE melted in the first bonding region BR1 and the second bonding region BR2 adjacent to the first non-bonding region NBR1 is moved to the through region TR.

In order to test the reliability of the ultrasonic bonding between the pad terminal PE and the lead terminal LE, an imaging device (not shown) may be used to extract necessary data by observing the lead terminal LE portion that is lowered and/or inserted into the through region TR, from the bottom of the base substrate 101. The imaging device may extract data on the second thickness T2 of the lead terminal LE and/or the width and/or area of the contact region CR extracted by observing the second thickness T2 of the lead terminal LE and/or the width and/or area of the contact region CR. Subsequently, the imaging device may compare the extracted data to standard data on the second thickness T2 and/or the width and/or area of the contact region CR to test the reliability of the ultrasonic bonding between the pad terminal PE and the lead terminal LE.

Figure 10:
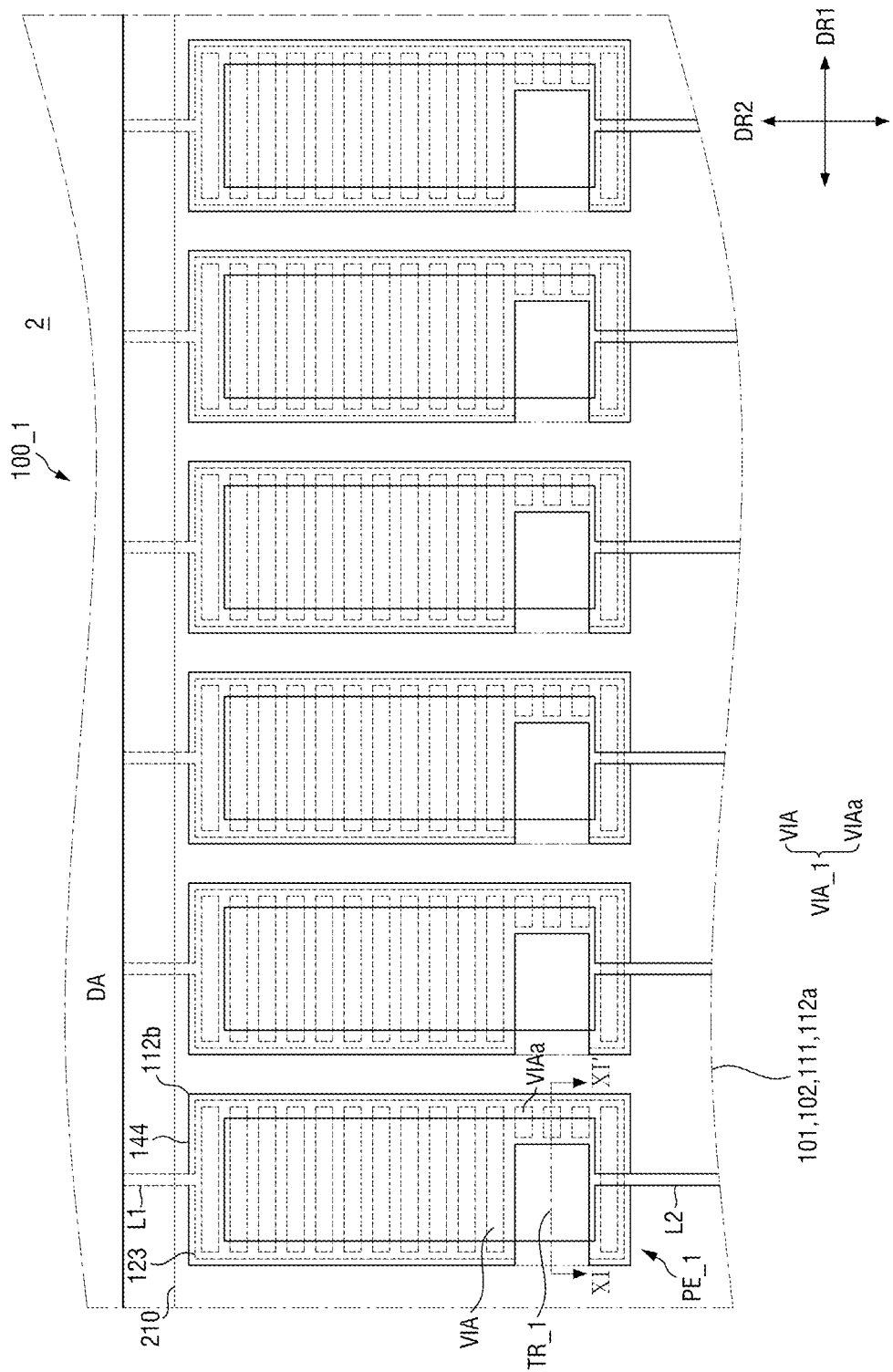
FIG. 10 is a plan layout view of a display panel and a flexible printed circuit board attached to each other according to another embodiment.
Figure 11:
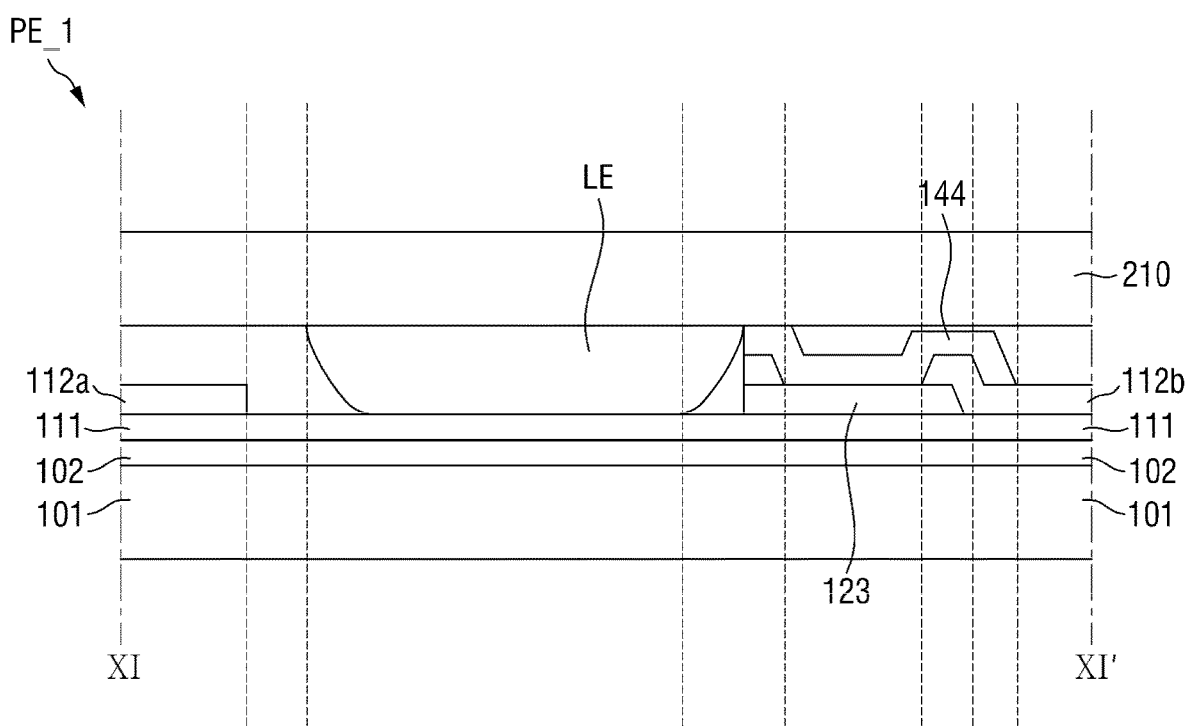
FIG. 11 is a cross-sectional view taken along line XI-XI' of FIG. 10.
Figure 11:
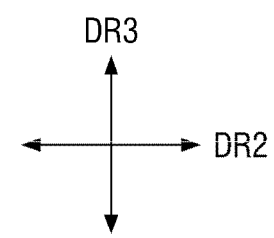

FIG. 10 is a plan layout view of a display panel and a flexible printed circuit board attached to each other according to another embodiment, and FIG. 11 is a cross-sectional view taken along line XI-XI' of FIG. 10.

Referring to FIGS. 10 and 11, a pad terminal PE_1 according to another embodiment is different from the pad terminal PE according to an earlier embodiment, in that a through region TR_1 is formed inward from the pad terminal PE_1 in a long side of the pad terminal PE_1.

More specifically, the pad terminal PE_1 according to this embodiment may have a through region TR_1 formed inward from the pad terminal PE_1 in one edge or a long side of the pad terminal PE_1. That is, the through region TR_1 according to this embodiment may include one edge or a long side of the pad terminal PE_1 and may be formed inward from the pad terminal PE_1. Also, the pad terminal PE_1 according to this embodiment may have a second sub-insulating layer 112a further disposed in a region adjacent to the through region TR_1 in the first direction DR1. The second sub-insulating layer 112a of this region may further include a via hole VIAa. The second sub-insulating layer 112a disposed in the region adjacent to the through region TR_1 in the first direction DR1 may be ultrasonically bonded to the lead terminal LE disposed above in the thickness direction.

The pad terminal PE_1 according to this embodiment has the second sub-insulating layer 112a further including the via hole VIAa. As a result, a region bonded to the lead terminal LE is enlarged, and thus it is possible to increase the entire bonding force.

Even in this case, the lead terminal LE coupled to the pad terminal PE_1 may be lowered and/or inserted into the through region TR_1 in the first non-bonding region NBR1 to come into contact with the exposed first insulating layer 111. The first insulating layer 111, the buffer layer 102, and the base substrate 101 disposed below the lead terminal LE brought into contact with the first insulating layer 111 may be made of a transparent material.

The second thickness T2 of the lead terminal LE and the width and area of the contact region CR may be increased when the ultrasonic bonding of the lead terminal LE is accomplished well. In detail, when the ultrasonic bonding is accomplished well, a larger amount of material of the lead terminal LE melted in the first bonding region BR1 and the second bonding region BR2 adjacent to the first non-bonding region NBR1 is moved to the through region TR_1.

In order to test the reliability of the ultrasonic bonding between the pad terminal PE_1 and the lead terminal LE, an imaging device (not shown) may be used to extract necessary data by observing the lead terminal LE portion that is lowered and/or inserted into the through region TR_1, from the bottom of the base substrate 101. The imaging device may extract data on the second thickness T2 of the lead terminal LE and/or the width and/or area of the contact region CR extracted by observing the second thickness T2 of the lead terminal LE and/or the width and/or area of the contact region CR. Subsequently, the imaging device may compare the extracted data to standard data on the second thickness T2 and/or the width and/or area of the contact region CR to test the reliability of the ultrasonic bonding between the pad terminal PE_1 and the lead terminal LE.

Figure 12:
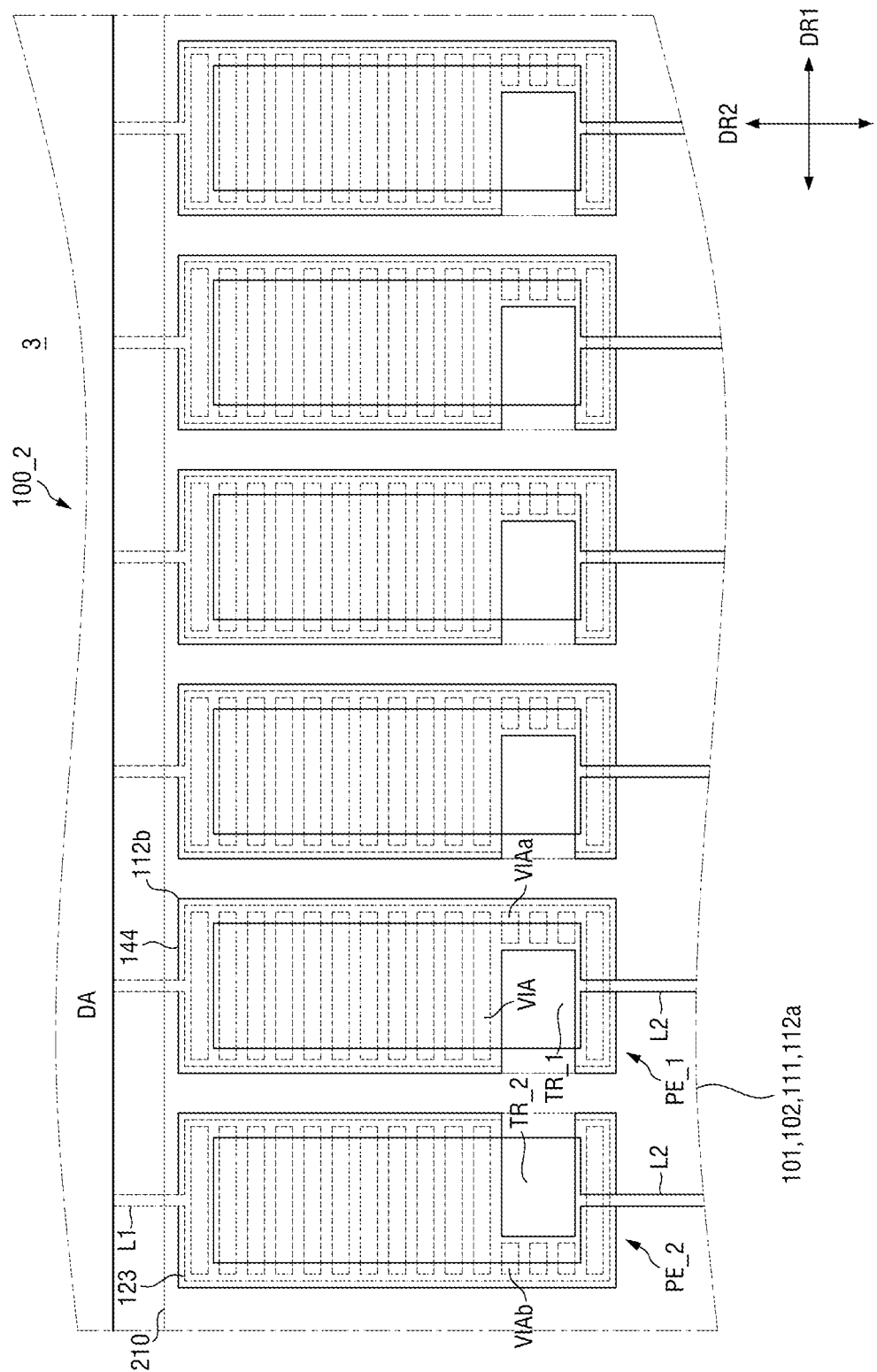
FIG. 12 is a plan layout view of a display panel and a flexible printed circuit board attached to each other according to still another embodiment.

FIG. 12 is a plan layout view of a display panel and a flexible printed circuit board attached to each other according to still another embodiment.

Referring to FIG. 12, a display device 3 according to still another embodiment is different from the pad terminal PE according to an earlier embodiment, in that the pad terminal PE_1 according to FIGS. 10 and 11 and a pad terminal PE_2 different from the pad terminal PE_1 are included.

More specifically, the display device according to this embodiment may include the pad terminal PE_1 according to FIGS. 10 and 11 and the pad terminal PE_2 according to this embodiment. The pad terminal PE_1 and the pad terminal PE_2 according to this embodiment may be repeatedly disposed. The pad terminal PE_2 according to this embodiment may have a symmetrical shape with respect to the pad terminal PE_1 according to FIGS. 10 and 11 in the second direction DR2. When the pad terminal PE_1 according to FIGS. 10 and 11 includes the through region TR_1 by including a long side or an edge of the pad terminal PE_1 on one side, the pad terminal PE_2 according to this embodiment may include a through region TR_2 by including a long side or an edge of the pad terminal PE_2 at the other side.

In order to form the through regions TR_1 and TR_2, the second pad electrode 144, the second sub-insulating layer 112b, and the first pad electrode 123 have to be cut with a predetermined width in the thickness direction. In the pad terminals PE_1 and PE_2 according to this embodiment, areas where the through regions are formed may face each other, and thus the through regions TR_1 and TR_2 may be formed at a time during the cutting process.

Figure 13:
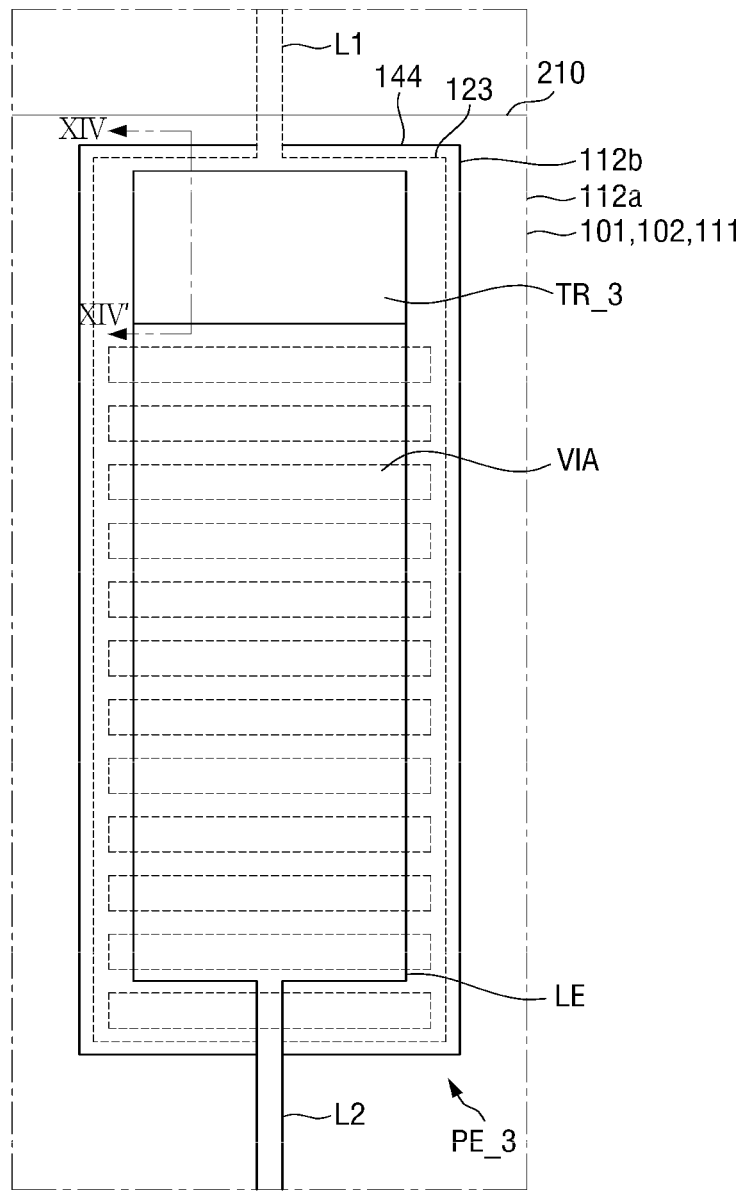
FIG. 13 is a plan view showing a pad terminal and a lead terminal attached to the pad terminal according to yet another embodiment.
Figure 14:
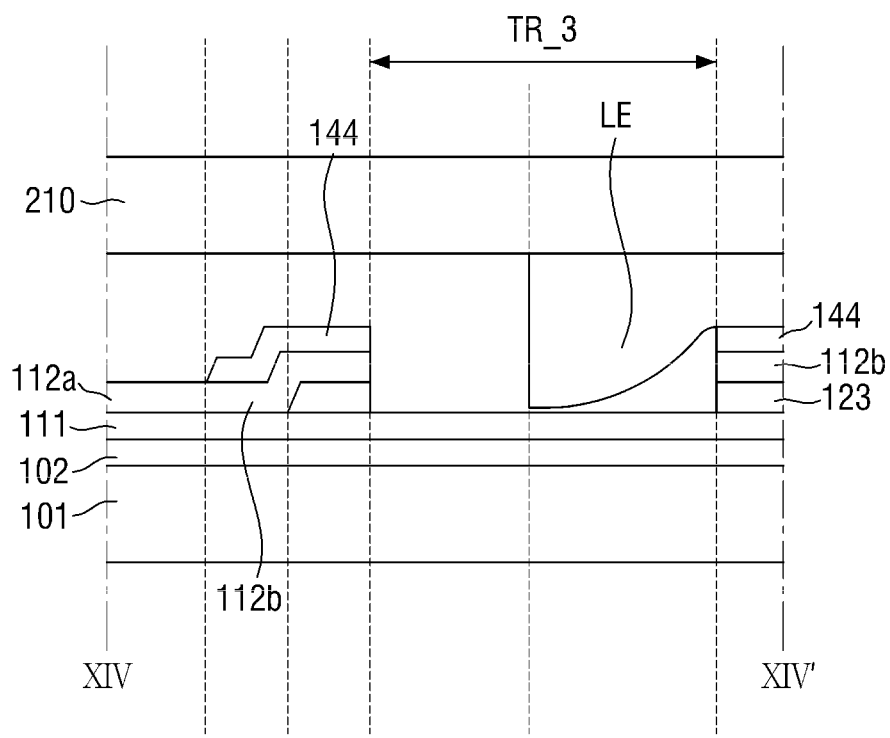
FIG. 14 is a cross-sectional view taken along line XIV-XIV' of FIG. 13.
Figure 14:
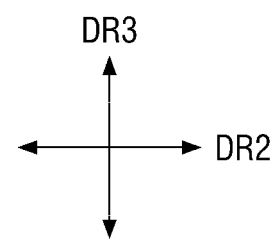

FIG. 13 is a plan view showing a pad terminal and a lead terminal attached to the pad terminal according to yet another embodiment, and FIG. 14 is a cross-sectional view taken along line XIV- XIV' of FIG. 13.

Referring to FIGS. 13 and 14, a display device 4 according to yet another embodiment is different from the display device 1 according to an embodiment in that only a portion of a through region TR_3 of a pad terminal PE_3 overlaps the lead terminal LE disposed above.

More specifically, in the case of the display device 4 according to this embodiment, the through region TR_3 of the pad terminal PE_3 may be disposed in an upper side of the pad terminal PE_3 in the second direction DR2 (disposed adjacent to the upper short side of the pad terminal PE_3), and only a portion of the through region TR_3 may overlap the lead terminal LE.

Even in this case, one end of the lead terminal LE coupled to the pad terminal PE_3 may be lowered and/or inserted into the through region TR_3 to come into contact with the exposed first insulating layer 111. The first insulating layer 111, the buffer layer 102, and the base substrate 101 disposed below the lead terminal LE brought into contact with the first insulating layer 111 may be made of a transparent material.

The second thickness T2 of the lead terminal LE and the width and area of the contact region CR may be increased when the ultrasonic bonding of the lead terminal LE is accomplished well. In detail, when the ultrasonic bonding is accomplished well, a larger amount of material of the lead terminal LE melted in the first bonding region BR1 and the second bonding region BR2 adjacent to the through region TR_3 is moved to the through region TR_3.

In order to test the reliability of the ultrasonic bonding between the pad terminal PE_3 and the lead terminal LE, an imaging device (not shown) may be used to extract necessary data by observing the lead terminal LE portion that is lowered and/or inserted into the through region TR_3 from the bottom of the base substrate 101. The imaging device may extract data on the second thickness T2 of the lead terminal LE and/or the width and/or area of the contact region CR extracted by observing the second thickness T2 of the lead terminal LE and/or the width and/or area of the contact region CR. Subsequently, the imaging device may compare the extracted data to standard data on the second thickness T2 and/or the width and/or area of the contact region CR to test the reliability of the ultrasonic bonding between the pad terminal PE_3 and the lead terminal LE.

Figure 15:
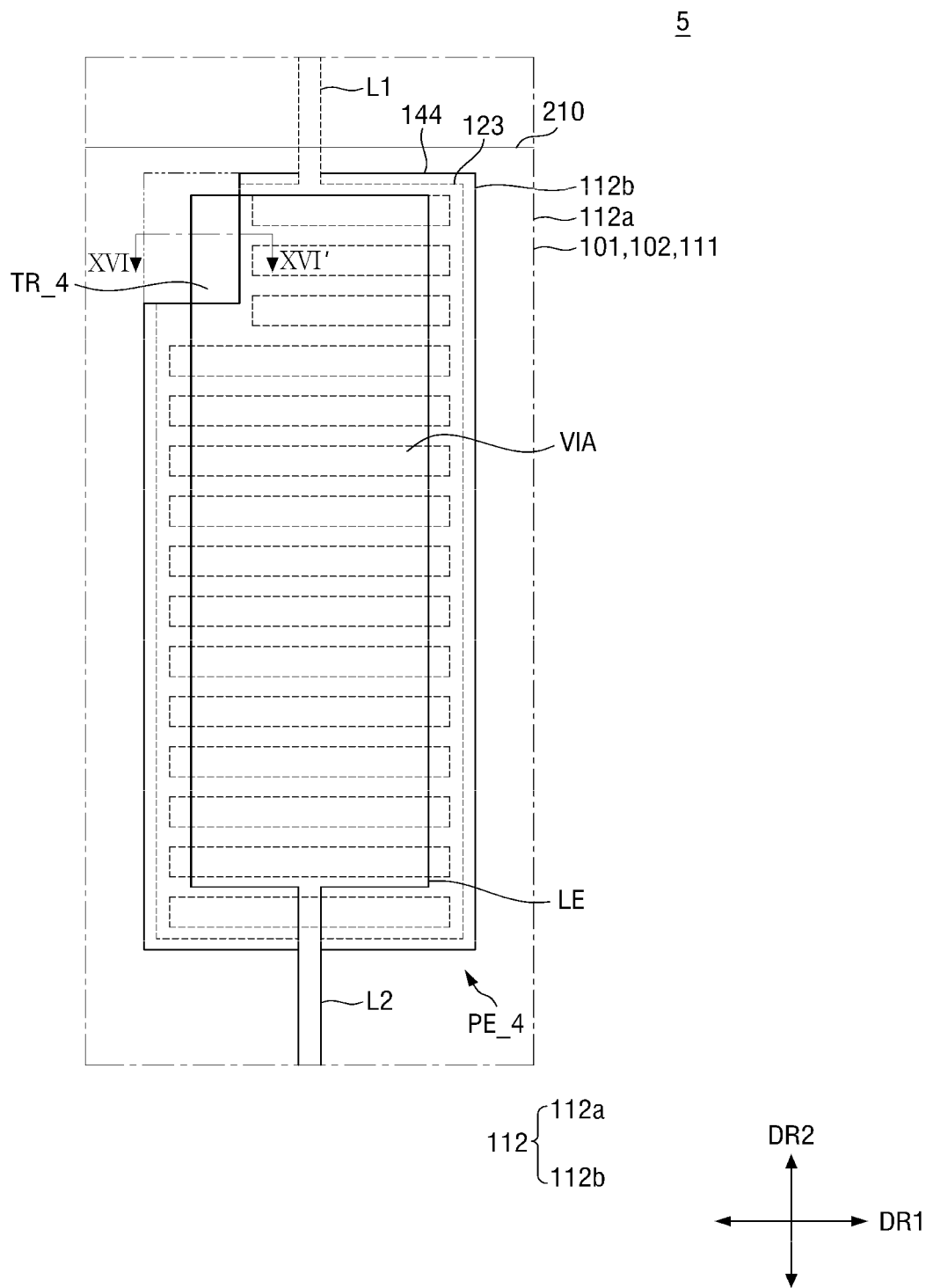
FIG. 15 is a plan view showing a pad terminal and a lead terminal attached to the pad terminal according to yet another embodiment.
Figure 16:
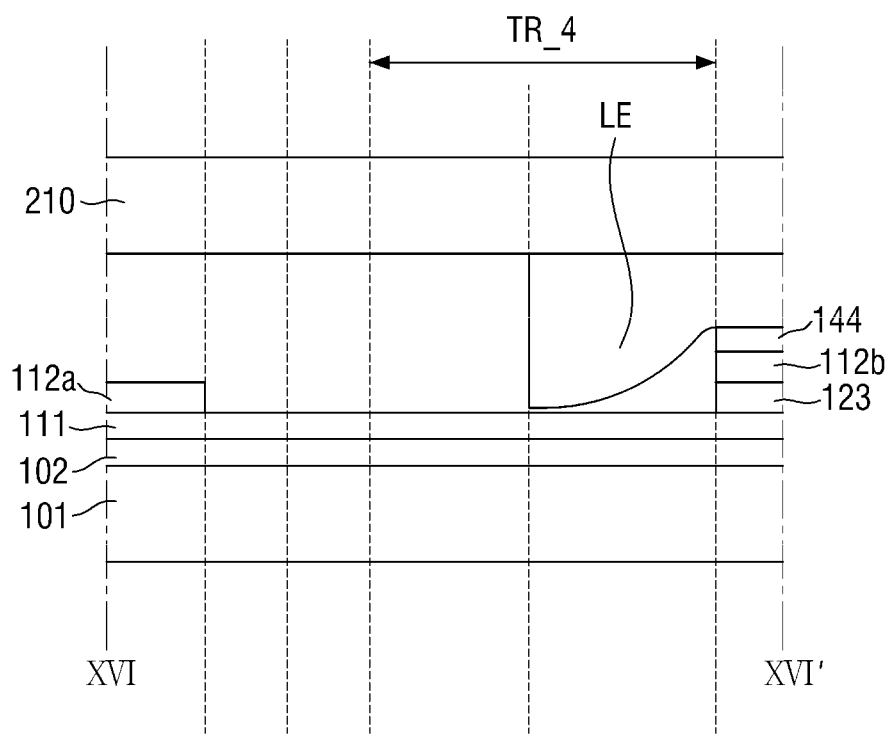
FIG. 16 is a cross-sectional view taken along line XVI-XVI' of FIG. 15.
Figure 16:
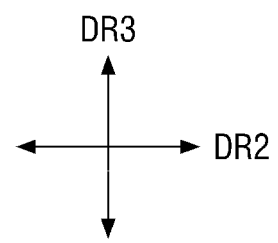

FIG. 15 is a plan view showing a pad terminal and a lead terminal attached to the pad terminal according to yet another embodiment, and FIG. 16 is a cross-sectional view taken along line XVI-XVI' of FIG. 15.

Referring to FIGS. 15 and 16, a display device 5 according to yet another embodiment is different from the display device 1 according to an earlier embodiment in that only a portion of a through region TR_4 of a pad terminal PE_4 overlaps the lead terminal LE disposed above.

More specifically, the through region TR_4 according to this embodiment may have a long side and a short side. The long side of the through region TR_4 may extend in the second direction DR2, and the short side of the through region TR_4 may extend in the first direction DR1. The through region TR_4 may be formed in the vicinity of a corner where a long side and a short side of the pad terminal PE_4 meet. In the drawing, it is shown that the through region TR_4 is disposed on the upper left side of the drawing. However, the present invention is not limited thereto, and the through region TR_4 may be disposed on the lower left side, the upper right side, and the lower right side.

Even in this case, one end of the lead terminal LE coupled to the pad terminal PE_4 may be lowered and/or inserted into the through region TR_4 to come into contact with the exposed first insulating layer 111. The first insulating layer 111, the buffer layer 102, and the base substrate 101 disposed below the lead terminal LE brought into contact with the first insulating layer 111 may be made of a transparent material.

The second thickness T2 of the lead terminal LE and/or the width and/or area of the contact region CR may be increased when the ultrasonic bonding of the lead terminal LE is accomplished well. In detail, when the ultrasonic bonding is accomplished well, a larger amount of material of the lead terminal LE melted in the first bonding region BR1 and the second bonding region BR2 adjacent to the through region TR_4 is moved to the through region TR_4.

In order to test the reliability of the ultrasonic bonding between the pad terminal PE_4 and the lead terminal LE, an imaging device (not shown) may be used to extract necessary data by observing the lead terminal LE portion that is lowered and/or inserted into the through region TR_4, from the bottom of the base substrate 101. The imaging device may extract data on the second thickness T2 of the lead terminal LE and/or the width and/or area of the contact region CR extracted by observing the second thickness T2 of the lead terminal LE and/or the width and/or area of the contact region CR. Subsequently, the imaging device may compare the extracted data to standard data on the second thickness T2 and/or the width and/or area of the contact region CR to test the reliability of the ultrasonic bonding between the pad terminal PE_4 and the lead terminal LE.

Figure 17:
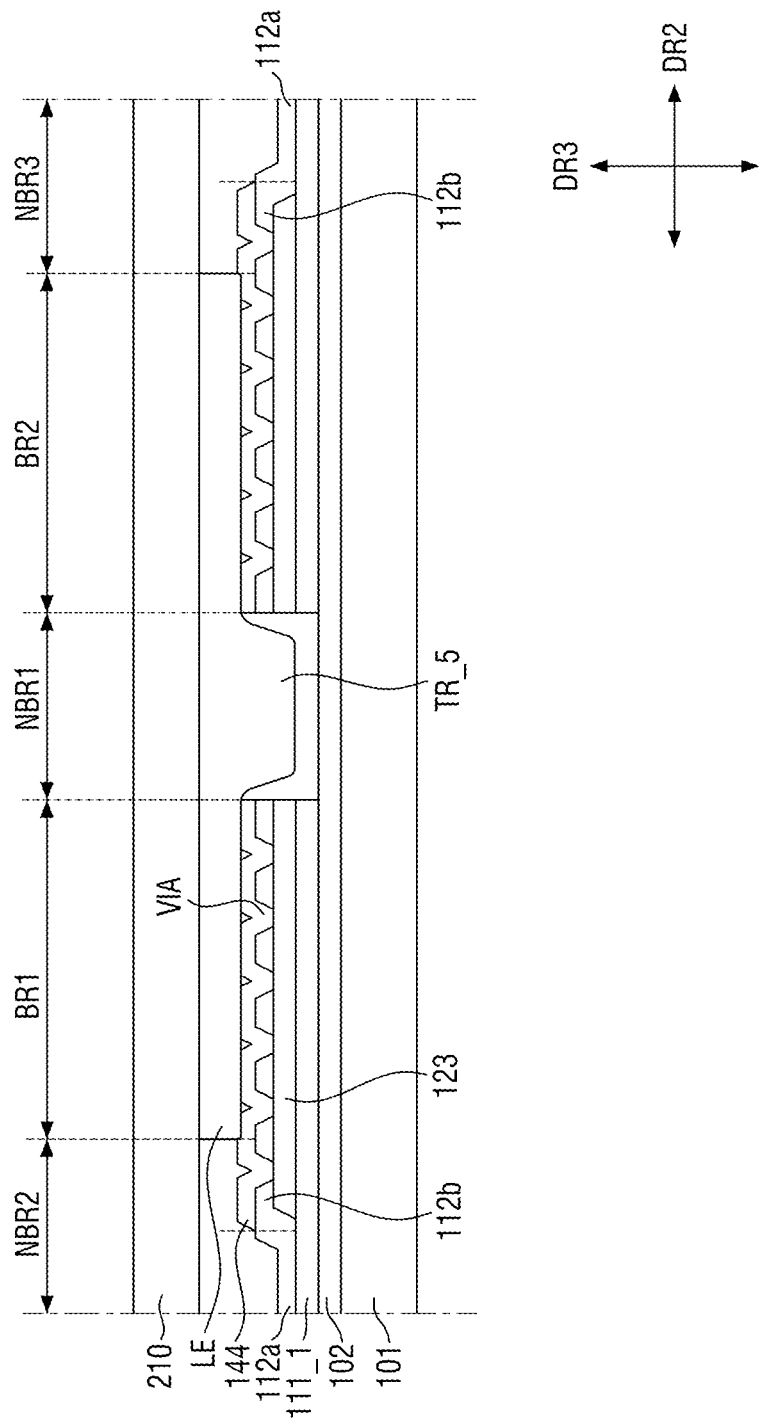
FIG. 17 is a cross-sectional view of a display device according to still another embodiment.

FIG. 17 is a cross-sectional view of a display device according to yet another embodiment.

Referring to FIG. 17, a through region TR_5 according to this embodiment is different from the through region TR according to an earlier embodiment in that the through region TR_5 is formed to pass from the surface of the second pad electrode 144 to a first insulating layer 111_1 in the thickness direction.

More specifically, the pad terminal PE_5 according to this embodiment may have the through region TR_5 that passes from the surface of the second pad electrode 144 to the first insulating layer 111_1 in the thickness direction. The through region TR_5 may expose an upper surface of the buffer layer 102. In the first non-bonding region NBR1, the lead terminal LE may be located inside the through region TR_5 and may not be brought into contact with the exposed upper surface of the buffer layer 102. However, the present invention is not limited thereto, and the lead terminal LE may be brought into contact with the exposed upper surface of the buffer layer 102. In this case, in the first non-bonding region NBR1, the lead terminal LE may be brought into contact with, but not coupled to, the exposed upper surface of the buffer layer 102. However, ultrasonic vibration may cause the lead terminal LE and the exposed upper surface of the buffer layer 102 to be melted, mixed, and coupled to each other in some regions of an interface therebetween. Even in this case, the bonding force between the lead terminal LE and the buffer layer 102 in the first non-bonding region NBR1 may be smaller than the bonding force between the lead terminal LE and the second pad electrode 144 in the bonding regions BR1 and BR2.

Even when the lead terminal LE is not in contact with the exposed upper surface of the buffer layer 102 inside the through region TR_5, the second thickness T2 of the lead terminal LE in the region may be increased when ultrasonic bonding is accomplished well. In detail, when the ultrasonic bonding is accomplished well, a larger amount of material of the lead terminal LE melted in the first bonding region BR1 and the second bonding region BR2 adjacent to the first non-bonding region NBR1 is moved to the through region TR_5.

In order to test the reliability of the ultrasonic bonding between the pad terminal PE_5 and the lead terminal LE, an imaging device may be used to extract necessary data by observing the lead terminal LE portion that is lowered and/or inserted into the through region TR_5 and disposed above the buffer layer 102, from the bottom of the base substrate 101. The imaging device may extract data on the second thickness T2 extracted by observing the second thickness T2 of the lead terminal LE. Subsequently, the imaging device may compare the extracted data to standard data on the second thickness T2 to test the reliability of the ultrasonic bonding between the pad terminal PE_5 and the lead terminal LE.

Figure 18:
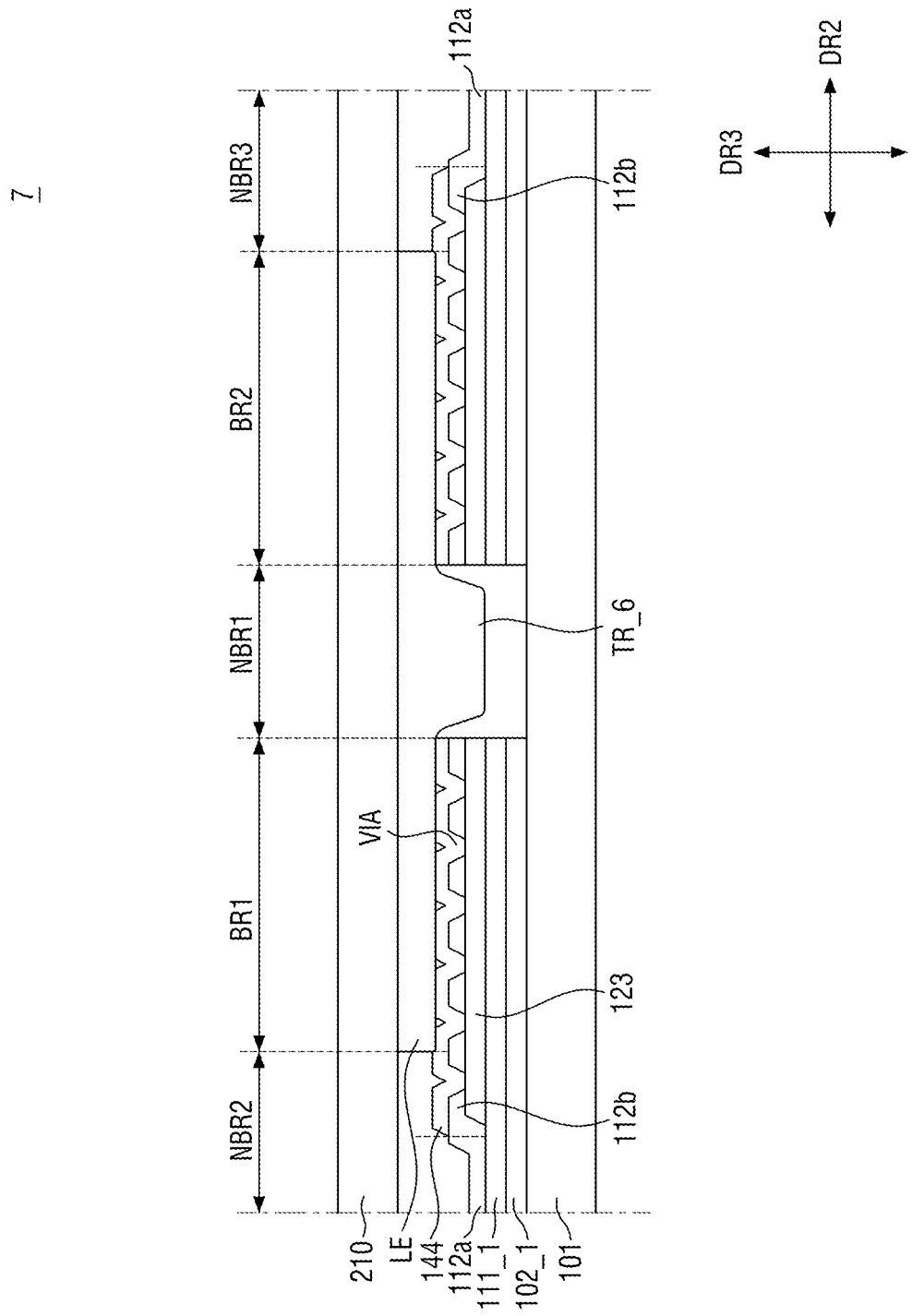
FIG. 18 is a cross-sectional view of a display device according to yet another embodiment.

FIG. 18 is a cross-sectional view of a display device according to yet another embodiment.

Referring to FIG. 18, a through region TR_6 according to this embodiment is different from the through region TR according to an earlier embodiment in that the through region TR_6 is formed to pass from the surface of the second pad electrode 144 to the buffer layer 102_1 in the thickness direction.

More specifically, the pad terminal PE_6 according to this embodiment may have the through region TR_6 that passes from the surface of the second pad electrode 144 to a buffer layer 102_1 in the thickness direction. That is, the through region TR_6 may pass through the second pad electrode 144, the second sub-insulating layer 112b, the first pad electrode 123, the first insulating layer 111_1, and the buffer layer 102_1. The through region TR_6 may expose an upper surface of the base substrate 101. In the first non-bonding region NBR1, the lead terminal LE may be located inside the through region TR_6 and may not be brought into contact with the exposed upper surface of the base substrate 101. However, the present invention is not limited thereto, and the lead terminal LE may be brought into contact with the exposed upper surface of the base substrate 101. In this case, in the first non-bonding region NBR1, the lead terminal LE may be brought into contact with, but not coupled to, the exposed upper surface of the base substrate 101. However, ultrasonic vibration may cause the lead terminal LE and the exposed upper surface of the base substrate 101 to be melted, mixed, and coupled to each other in some regions of an interface therebetween. Even in this case, the bonding force between the lead terminal LE and the base substrate 101 in the first non-bonding region NBR1 may be smaller than the bonding force between the lead terminal LE and the second pad electrode 144 in the bonding regions BR1 and BR2.

Even when the lead terminal LE is not in contact with the exposed upper surface of the base substrate 101 inside the through region TR_6, the second thickness T2 of the lead terminal LE in the region may be increased when ultrasonic bonding is accomplished well. In detail, when the ultrasonic bonding is accomplished well, a larger amount of material of the lead terminal LE melted in the first bonding region BR1 and the second bonding region BR2 adjacent to the first non-bonding region NBR1 is moved to the through region TR_6.

In order to test the reliability of the ultrasonic bonding between the pad terminal PE_6 and the lead terminal LE, an imaging device may be used to extract necessary data by observing the lead terminal LE portion that is lowered and/or inserted into the through region TR_6 and disposed above the base substrate 101, from the bottom of the base substrate 101. The imaging device may extract data on the second thickness T2 extracted by observing the second thickness T2 of the lead terminal LE. Subsequently, the imaging device may compare the extracted data to standard data on the second thickness T2 to test the reliability of the ultrasonic bonding between the pad terminal PE_6 and the lead terminal LE.

Figure 19:
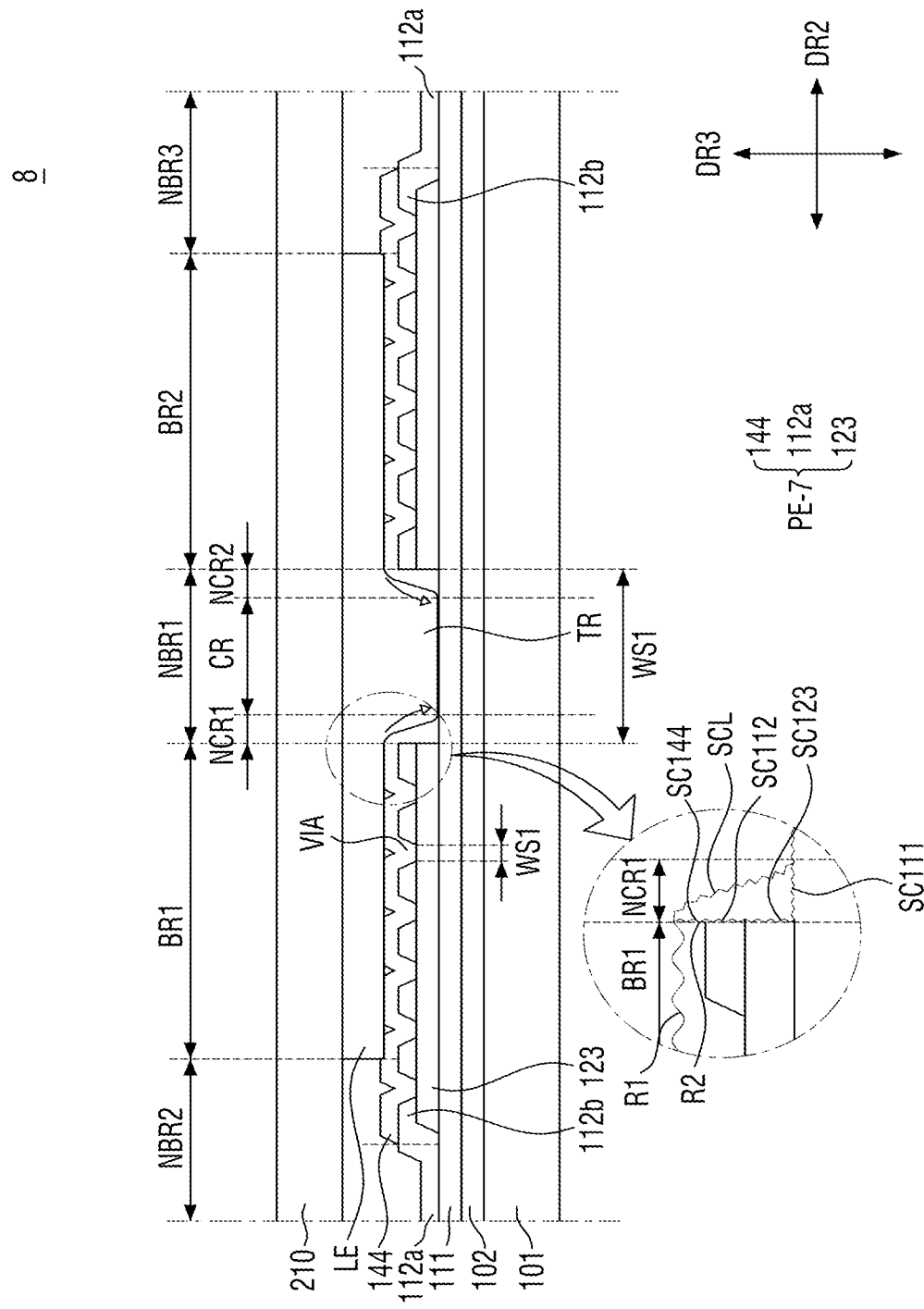
FIG. 19 is a cross-sectional view of a display device according to yet another embodiment.

FIG. 19 is a cross-sectional view of a display device according to yet another embodiment.

Referring to FIG. 19, a pad terminal PE_7 according to this embodiment is different from the pad terminal PE according to an earlier embodiment in that both exposed side surfaces of the second pad electrode 144, both exposed side surfaces of the second sub-insulating layer 112b, and both exposed side surfaces of the first pad electrode 123 include a first scratch SC144, a second scratch SC112, and a third scratch SC123, respectively, in that the side surfaces of the lead terminal LE opposite to both side surfaces of the second pad electrode 144, both side surfaces of the second sub-insulating layer 112b, and both side surfaces of the first pad electrode 123 have a fourth scratch SCL, and in that one exposed surface of the first insulating layer 111 has a fifth scratch SC111.

More specifically, the second pad electrode 144 may have the first scratch SC144. The second sub-insulating layer 112b may have the second scratch SC112. The first pad electrode 123 may have the third scratch SC123. The lead terminal LE may have the fourth scratch SCL. The first insulating layer 111 may have the fifth scratch SC111.

As described above, the ultrasonic device 500 may vibrate the lead terminal LE in a vibration direction while vibrating in the predetermined vibration direction. For example, the ultrasonic device 500 may vibrate in the second direction DR2 (in a long side direction of the pad terminal PE-7). In this case, the lead terminal LE inserted and/or lowered into the through region TR and disposed between both opposite side surfaces of the second pad electrode 144 (including the second sub-insulating layer 112b and the first pad electrode 123) may vibrate in the second direction DR2 to come into contact with both side surfaces of the second pad electrode 144, both side surfaces of the second sub-insulating layer 112b, and both side surfaces of the first pad electrode 123. Thus, both exposed side surfaces of the second pad electrode 144, both exposed side surfaces of the second sub-insulating layer 112b, and both exposed side surfaces of the first pad electrode 123 may include the first scratch SC144, the second scratch SC112, and the third scratch SC123, respectively, and the side surfaces of the lead terminal LE opposite to both side surfaces of the second pad electrode 144, both side surfaces of the second sub-insulating layer 112b, and both side surfaces of the first pad electrode 123 may have the fourth scratch SCL. Also, through the ultrasonic bonding process, the exposed upper surface of the first insulating layer 111 may rub against one surface of the lead terminal LE in contact with the upper surface and thus may have the fifth scratch SC111.

These elements having the scratches SC144, SC112, SC123, and SCL may be unintentionally formed due to the intensity and/or amplitude of ultrasonic waves during the ultrasonic bonding.

Furthermore, in the first and second bonding regions BR1 and BR2, the second pad electrode 144 may have a first roughness R1 on one surface of the second pad electrode 144 facing the lead terminal LE. In the first non-bonding region NBR1, the exposed side surface of the second pad electrode 144 may have a second roughness R2.

During the ultrasonic bonding process, the second pad electrode 144 may have one surface facing the lead terminal LE (i.e., the surface of the pad terminal PE_7) that rubs against the lead terminal LE vibrating in the second direction DR2. When one surface of the second pad electrode 144 facing the lead terminal LE is repeatedly rubbed in a certain vibration direction, scratches may be formed in at least some areas.

However, as the ultrasonic bonding process proceeds, such a scratch may be at least filled up or covered by the lead terminal LE and/or the pad terminal PE partially melted in the bonding regions BR1 and BR2.

However, even if the ultrasonic bonding process proceeds, the first scratch SC144 of the exposed side surface of the second pad electrode 144 in the first non-bonding region NBR1 may not be filled up or covered because the lead terminal LE and the pad terminal PE do not melt entirely, or do not melt sufficiently such that the lead terminal LE and the pad terminal PE can be coupled to each other. Thus, the exposed side surface of the second pad electrode 144 may have more scratches SC than one surface of each of the bonding regions BR1 and BR2 or may have scratches deeper in the thickness direction than one surface of each of the bonding regions BR1 and BR2 even if the number of surfaces is the same. Accordingly, the surface roughness R2 of the side surface of the pad terminal PE in the first non-bonding region NBR1 may be greater than the surface roughness R1 of one surface of each of the bonding regions BR1 and BR2.

Figure 20:
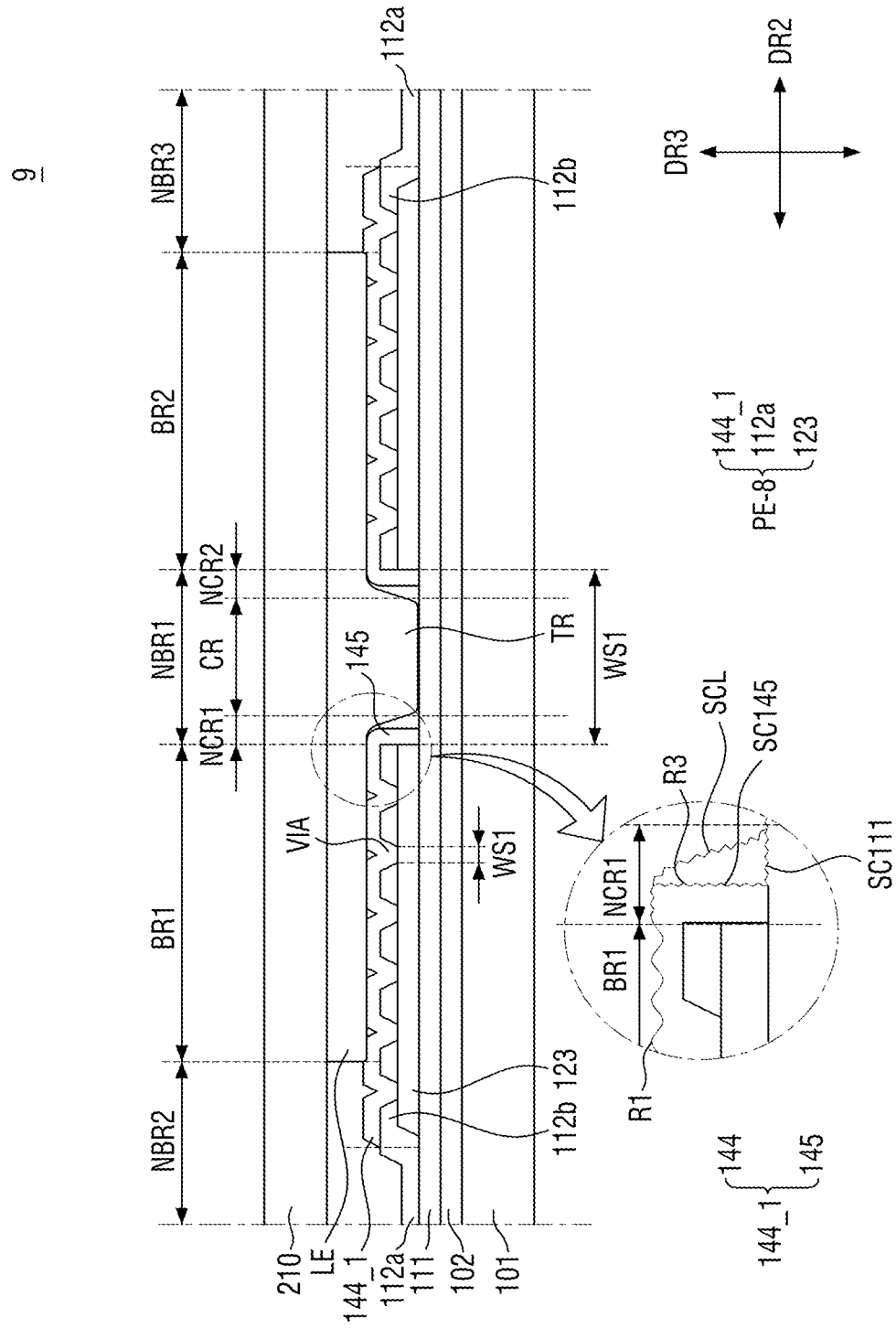
FIG. 20 is a cross-sectional view of a display device according to yet another embodiment.

FIG. 20 is a cross-sectional view of a display device according to yet another embodiment.

Referring to FIG. 20, a pad terminal PE-8 according to this embodiment is different from the pad terminal PE according to an embodiment in that a second pad electrode 144_1 further extends from a boundary between the first bonding region BR1 and the first non-bonding region NBR1 and a boundary between the second bonding region BR2 and the first non-bonding region NBR1 to the first non-bonding region NBR1 to cover both exposed side surfaces of the second sub-insulating layer 112b and both exposed side surface of the first pad electrode 123.

More specifically, the pad terminal PE-8 according to this embodiment may further include a second sub-pad electrode 145 obtained by the second pad electrode 144_1 further extending from the boundary between the first bonding region BR1 and the first non-bonding region NBR1 and the boundary between the second bonding region BR2 and the first non-bonding region NBR1 to the first non-bonding region NBR1. The second sub-pad electrode 145 may cover both exposed side surfaces of the first pad electrode 123 and both exposed side surfaces of the second sub-insulating layer 112b.

The second pad electrode 144_1 according to this embodiment may be formed after the through region TR is formed.

Side surfaces opposite to the lead terminal LE disposed in the through region TR of the second sub-pad electrode 145 may have a sixth scratch SC145.

In the first non-bonding region NBR1, an exposed side surface of the second sub-pad electrode 145 opposite to the lead terminal LE may have a third roughness R3. The third roughness R3 may be greater than the first roughness R1.

Figure 21:
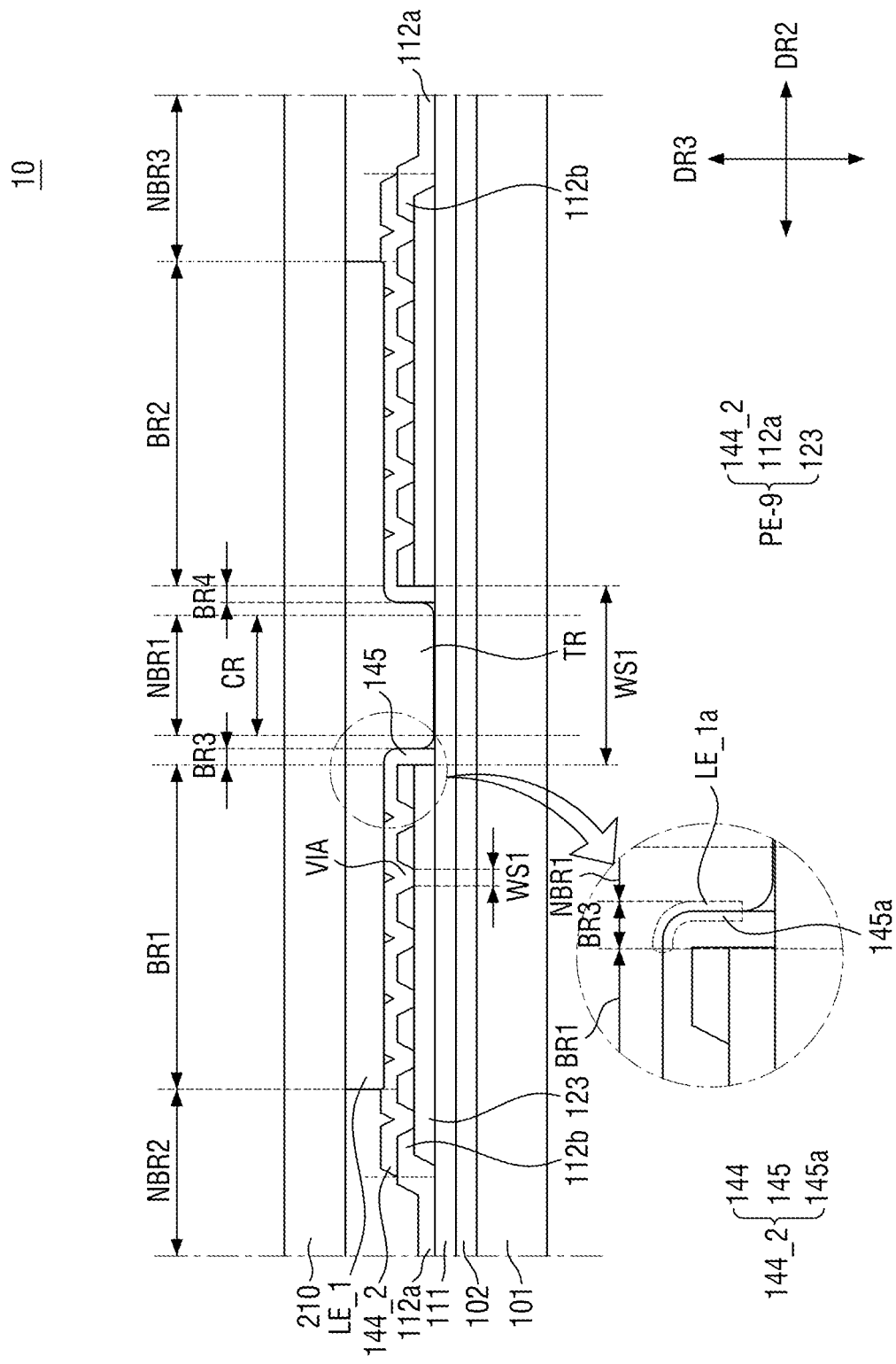
FIG. 21 is a cross-sectional view of a display device according to yet another embodiment.

FIG. 21 is a cross-sectional view of a display device according to yet another embodiment.

Referring to FIG. 21, a pad terminal PE-9 according to this embodiment is different from the pad terminal PE according to an earlier embodiment, in that a second pad electrode 144_2 further extends from a boundary between the first bonding region BR1 and the first non-bonding region NBR1 and a boundary between the second bonding region BR2 and the first non-bonding region NBR1 to the first non-bonding region NBR1 to cover both exposed side surfaces of the second sub-insulating layer 112b and both exposed side surface of the first pad electrode 123, and in that the second sub-pad electrode 144_2 is ultrasonically bonded to a lead terminal LE_1 that is disposed in the first non-bonding region NBR1 and disposed inside the through region TR.

More specifically, the pad terminal PE-9 according to this embodiment may have substantially the same layout as the pad terminal PE-8 shown in FIG. 20, but the second sub-pad electrode 144_2 may be ultrasonically bonded to the lead terminal LE_1 that is disposed in the first non-bonding region NBR1 and disposed inside the through region TR.

When the lead terminal LE_1 is ultrasonically vibrated on one surface of the pad terminal PE_9, a predetermined frictional force is generated at an interface between a side surface of the lead terminal LE_1 and a side surface of the second sub-pad terminal 145 inside the through region TR, and frictional heat may be generated due to the frictional force. When the frictional heat is sufficient to melt materials forming the second sub-pad terminal 145 and the lead terminal LE_1, a panel melting area 145a adjacent to the lead terminal LE_1 of the second sub-pad terminal 145 and a lead melting area LE_1a adjacent to the second sub-pad terminal 145 of the lead terminal LE_1 may be melted. That is, the second sub-pad terminal 145 may include the panel melting area 145a. Also, the lead terminal LE_1 may include the lead melting area LE_1a.

The panel melting area 145a may be an area where the material contained in the lead terminal LE_1 is diffused such that the material of the second sub-pad terminal 145 and the material of the lead terminal LE_1 are mixed, and the lead melting area LE_1a may be an area where the material contained in the second sub-pad terminal 145 is diffused such that the material of the lead terminal LE_1 and the material of the second sub-pad terminal 145 are mixed. For example, when the lead terminal LE_1 contains silver (Ag), gold (Au), or copper (Cu) and the second sub-pad terminal 145 contains Ti/Al/Ti, the panel melting area 145a may be an area where Ti and/or Al of the second sub-pad terminal 145 and silver (Ag), gold (Au), or copper (Cu) of the lead terminal LE_1 are mixed. Also, the lead melting area LE_1a may be an area where silver (Ag), gold (Au), or copper (Cu) of the lead terminal LE and Ti and/or Al of the second sub-pad terminal 145 are mixed.

In the panel melting area 145a and the lead melting area LE_1a, the second sub-pad terminal 145 and the lead terminal LE_1 may be coupled to each other while undergoing solidification.

An interface between the second sub-pad terminal 145 and the lead terminal LE_1, that is, an interface between the panel melting area 145a and the lead melting area LE_1a may have a non-flat shape.

While the present invention has been described with reference to example embodiments, these are just examples and do not limit the present invention. It will be understood by those skilled in the art that various modifications and applications may be made therein without departing from the essential characteristics of the embodiments. For example, elements described in the embodiments above in detail may be modified. Furthermore, differences associated with such modifications and applications should be construed as being included in the scope of the present invention defined by the appended claims.

DESCRIPTION OF REFERENCE NUMERALS

100: Display Panel
120: First Conductive Layer
130: Second Conductive Layer
140: Third Conductive Layer
200: Flexible Printed Circuit Film (Board)
290: Data Driving Integrated Circuit

The invention claimed is:

1. A display panel comprising:
a display substrate comprising:
   a display area; and
   a pad area disposed around the display area;
at least one pad terminal on the display substrate in the pad area; and
an open portion at least partially surrounded by the pad terminal in a plan view,
   wherein the open portion passes through the pad terminal from a surface of the pad terminal in a thickness direction and
   the open portion is disposed inside the pad terminal and completely surrounded by the pad terminal in a plan view.

2. The display panel of claim 1, wherein the pad terminal comprises:
a first pad electrode; and
a second pad electrode on the first pad electrode and electrically connected to the first pad electrode.

3. The display panel of claim 2, wherein the pad terminal comprises an insulating layer between the first pad electrode and the second pad electrode.

4. The display panel of claim 3, wherein the insulating layer comprises a plurality of insulating patterns, the insulating patterns exposing an upper surface of the first pad electrode.

5. The display panel of claim 4, wherein the second pad electrode covers the plurality of insulating patterns and the exposed upper surface of the first pad electrode.

6. The display panel of claim 5, wherein the second pad electrode comprises surface unevenness by conformally reflecting a stepped portion formed by the plurality of insulating patterns.

7. The display panel of claim 3, wherein the open portion comprises a through-hole passing through the first pad electrode, the second pad electrode, and the insulating layer.

8. The display panel of claim 7, wherein the through-hole is inside the pad terminal and completely surrounded by the first pad electrode and the second pad electrode in a plan view.

9. The display panel of claim 1, wherein the at least one pad terminal comprises:
a first pad terminal; and
a second pad terminal adjacent to each other, an open portion of the first pad terminal and an open portion of the second pad terminal facing each other.

10. A display panel comprising:
a display substrate comprising:
   a display area, and
   a pad area disposed around the display area;
at least one pad terminal on the display substrate in the pad area; and
an open portion at least partially surrounded by the pad terminal in a plan view,
   wherein the open portion passes through the pad terminal from a surface of the pad terminal in a thickness direction and
   wherein the open portion has a trench shape that is recessed from one edge of the pad terminal in a plan view.

11. A display device comprising:
a display substrate comprising:
   a display area; and
   a pad area disposed around the display area;
a pad terminal on the display substrate in the pad area, the pad terminal comprising:
   a first pad electrode; and
   a second pad electrode on the first pad electrode and electrically connected to the first pad electrode;
   an open portion at least partially surrounded by the pad terminal; and
a circuit board comprising a lead terminal attached to the pad area and connected to the pad terminal,
   wherein the lead terminal comprises a first area overlapping the open portion of the pad terminal.

12. The display device of claim 11, wherein the lead terminal comprises a second area disposed around the first area and not overlapping the open portion.

13. The display device of claim 12, wherein the lead terminal fills at least a portion of the open portion in the first area.

14. The display device of claim 13, wherein a first thickness of the lead terminal in the first area is greater than a second thickness of the lead terminal in the second area.

15. The display device of claim 11, wherein the lead terminal is in direct contact with the pad terminal.

16. The display device of claim 15, wherein the lead terminal and the pad terminal are ultrasonically bonded to each other.

17. The display device of claim 11, wherein the open portion comprises a through-hole passing through the first pad electrode and the second pad electrode in a thickness direction.

18. The display device of claim 17, wherein the through-hole is inside the pad terminal and completely surrounded by the pad terminal in a plan view.

* * * * *